(12) United States Patent
Choi et al.

(10) Patent No.: US 12,051,664 B2
(45) Date of Patent: Jul. 30, 2024

(54) SEMICONDUCTOR DEVICE AND DATA STORAGE SYSTEM INCLUDING A LANDING PAD ON AN EXTERNAL SIDE REGION OF A BYPASS VIA

(71) Applicant: SAMSUNG ELECTRONICS CO., LTD., Suwon-si (KR)

(72) Inventors: Moorym Choi, Yongin-si (KR); Jungtae Sung, Seoul (KR); Junyoung Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 137 days.

(21) Appl. No.: 17/543,250

(22) Filed: Dec. 6, 2021

(65) Prior Publication Data

US 2022/0285302 A1 Sep. 8, 2022

(30) Foreign Application Priority Data

Mar. 5, 2021 (KR) ........................ 10-2021-0029378

(51) Int. Cl.
*H01L 25/065* (2023.01)
*H01L 23/00* (2006.01)
(Continued)

(52) U.S. Cl.
CPC .............. *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ....... H01L 25/0657; H01L 2224/08145; H01L 24/08; H01L 24/80; H01L 25/18; H01L 2924/14511; H01L 2224/48145; H01L 2224/32145; H01L 2224/80895; H01L 2224/80896
See application file for complete search history.

(56) References Cited

U.S. PATENT DOCUMENTS 9,035,371 B2 5/2015 Nakajima
10,692,881 B2 6/2020 Hwang et al.
(Continued)

*Primary Examiner* — Thanh Y. Tran
(74) *Attorney, Agent, or Firm* — Myers Bigel, P.A.

(57) ABSTRACT

A semiconductor device includes a first semiconductor structure including a first substrate, circuit devices on the first substrate, a lower interconnection structure on the circuit devices, and a lower bonding structure electrically connected to the lower interconnection structure, and a second semiconductor structure including a second substrate disposed on the first semiconductor structure, gate electrodes stacked and spaced apart from each other in a first direction perpendicular to a lower surface of the second substrate, channel structures that penetrate the gate electrodes and extend in the first direction, and an upper bonding structure electrically connected to the gate electrodes and the channel structures and bonded to the lower bonding structure. The second semiconductor structure further includes a first via connected to an upper portion of the second substrate, a second via spaced apart from the first via and the second substrate, and a contact plug.

20 Claims, 18 Drawing Sheets

(51) Int. Cl.
*H01L 25/00* (2006.01)
*H01L 25/18* (2023.01)

(56) References Cited

U.S. PATENT DOCUMENTS

| | | |
|---|---|---|
| 10,741,527 B2 | 8/2020 | Tagami et al. |
| 10,811,058 B2 | 10/2020 | Zhang et al. |
| 2014/0141610 A1 | 5/2014 | Jin et al. |
| 2020/0203316 A1 | 6/2020 | Morein et al. |
| 2020/0286842 A1 | 9/2020 | Sanuki |
| 2020/0350322 A1 | 11/2020 | Liu et al. |
| 2022/0101911 A1* | 3/2022 | Kanamori ............ H10B 43/40 |
| 2022/0122933 A1* | 4/2022 | Hwang ................ H10B 43/27 |
| 2022/0181284 A1* | 6/2022 | Shin ..................... H01L 24/08 |
| 2022/0320025 A1* | 10/2022 | Choi .................... H10B 43/40 |

\* cited by examiner

SEMICONDUCTOR DEVICE AND DATA STORAGE SYSTEM INCLUDING A LANDING PAD ON AN EXTERNAL SIDE REGION OF A BYPASS VIA

CROSS TO REFERENCE TO RELATED APPLICATION(S)

This application claims benefit of priority to Korean Patent Application No. 10-2021-0029378 filed on Mar. 5, 2021 in the Korean Intellectual Property Office, the disclosure of which is incorporated herein by reference in its entirety.

BACKGROUND

Example embodiments of the present disclosure relate to a semiconductor device and a data storage system including the same.

There has been demand for a semiconductor device for storing high-capacity data in an electronic system requiring data storage. Accordingly, a method of increasing data storage capacity of a semiconductor device has been researched. For example, as one method for increasing data storage capacity of a semiconductor device, a semiconductor device including memory cells arranged three-dimensionally, instead of memory cells arranged two-dimensionally, has been suggested.

SUMMARY

Example embodiments of the present disclosure provide a semiconductor device in which reliability and/or productivity/production yield may be improved.

Example embodiments of the present disclosure provide a data storage system including a semiconductor device in which reliability and/or productivity/production yield may be improved.

According to example embodiments of the present disclosure, a semiconductor device includes a first semiconductor structure including a first substrate, circuit devices on the first substrate, a lower interconnection structure on the circuit devices, and a lower bonding structure electrically connected to the lower interconnection structure, and a second semiconductor structure including a second substrate on the first semiconductor structure, gate electrodes stacked and spaced apart from each other in a first direction perpendicular to a lower surface of the second substrate, channel structures that penetrate the gate electrodes and extend in the first direction, and an upper bonding structure electrically connected to the gate electrodes and the channel structures and bonded to the lower bonding structure. Each of the channel structures includes a channel layer. The second semiconductor structure further includes a first via connected to an upper portion of the second substrate, a second via spaced apart from the first via and spaced apart from the second substrate, and a contact plug in direct contact with the second via in an external side region of the second substrate.

According to example embodiments of the present disclosure, a semiconductor device includes a first substrate, circuit devices on the first substrate, a lower interconnection structure electrically connected to the circuit devices, a lower bonding structure electrically connected to the lower interconnection structure, an upper bonding structure in contact with the lower bonding structure, an upper interconnection structure electrically connected to the upper bonding structure, a second substrate on the upper interconnection structure, gate electrodes between the upper interconnection structure and the second substrate. The gate electrodes are stacked and are spaced apart from each other. The semiconductor device includes channel structures that penetrate the gate electrodes. Each of the channel structures includes a channel layer. The semiconductor device includes a contact plug that extends in a vertical direction perpendicular to an upper surface of the first substrate in an external side region of the gate electrodes and an external side region of the second substrate. The contact plug includes an upper end having a width smaller than a width of a lower end. The semiconductor device includes a landing via with a lower end in direct contact with the upper end of the contact plug, and with an upper end on a level higher than a level of an upper surface of the second substrate. The landing via is spaced apart from the second substrate.

According to example embodiments of the present disclosure, a data storage system includes a semiconductor device including a first substrate, circuit devices disposed on the first substrate, a lower interconnection structure electrically connected to the circuit devices, a lower bonding structure electrically connected to the lower interconnection structure, an upper bonding structure in contact with the lower bonding structure, an upper interconnection structure electrically connected to the upper bonding structure, a second substrate on the upper interconnection structure, gate electrodes between the upper interconnection structure and the second substrate and stacked and spaced apart from each other, channel structures that penetrate the gate electrodes and each include a channel layer, a contact plug that extends in a vertical direction perpendicular to an upper surface of the first substrate in an external side region of the gate electrodes and an external side region of the second substrate, and has an upper end with a width that is smaller than a width of a lower end, a landing via with a lower end in direct contact with the upper end of the contact plug, with an upper end on a level higher than a level of an upper surface of the second substrate, and spaced apart from the second substrate, and an input/output pad in contact with the landing via and electrically connected to the circuit devices through the contact plug, and a controller electrically connected to the semiconductor storage device through the input/output pad. The controller is configured to control the semiconductor storage device.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described as follows with reference to the accompanying drawings.

Figure 1:
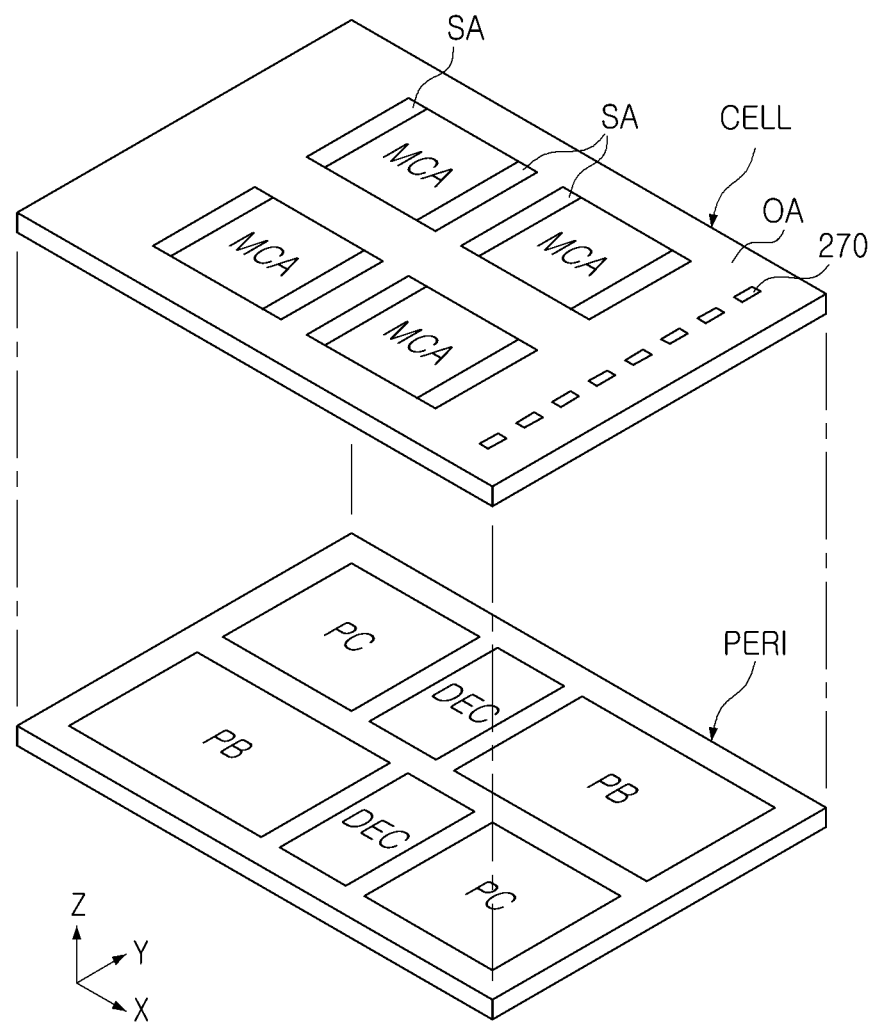
FIG. 1 is an exploded perspective view illustrating a semiconductor device according to example embodiments of the present disclosure.

FIG. 1 is an exploded perspective view illustrating a semiconductor device according to an example embodiment.

Referring to FIG. 1, a semiconductor device 100 according to example embodiments may include a peripheral circuit region PERI and a memory cell region CELL stacked in a vertical direction. The peripheral circuit region PERI and the memory cell region CELL may be bonded to and/or combined with each other. The memory cell region CELL may include a memory cell array region MCA, a staircase region SA adjacent to the memory cell array region MCA, and an external side region OA on external sides of the above elements. A conductive pad 270, such as an input/output pad, may be disposed in the external side region OA. A plurality of the memory cell array regions MCA may be disposed in the memory cell region CELL.

The peripheral circuit region PERI may include a row decoder DEC, a page buffer PB, and other peripheral circuits PC. In the peripheral circuit region PERI, the row decoder DEC may generate driving signals of a word line by decoding an input address and may transmit the signals. The page buffer PB may be connected to the memory cell array region MCA via bit lines and may read data stored in the memory cells. The other peripheral circuit PC may be a region including a control logic and a voltage generator, and may include, for example, a latch circuit, a cache circuit, and/or a sense amplifier. The peripheral circuit region PERI may further include a separate pad region. In this case, the pad region may include an electrostatic discharge (ESD) device or a data input/output circuit. The ESD device or the data input/output circuit in the pad region may be electrically connected to the conductive pad 270 in the external side region OA. Various circuit regions DEC, PB, and PC in the peripheral circuit region PERI may be disposed in various shapes.

Figure 2:
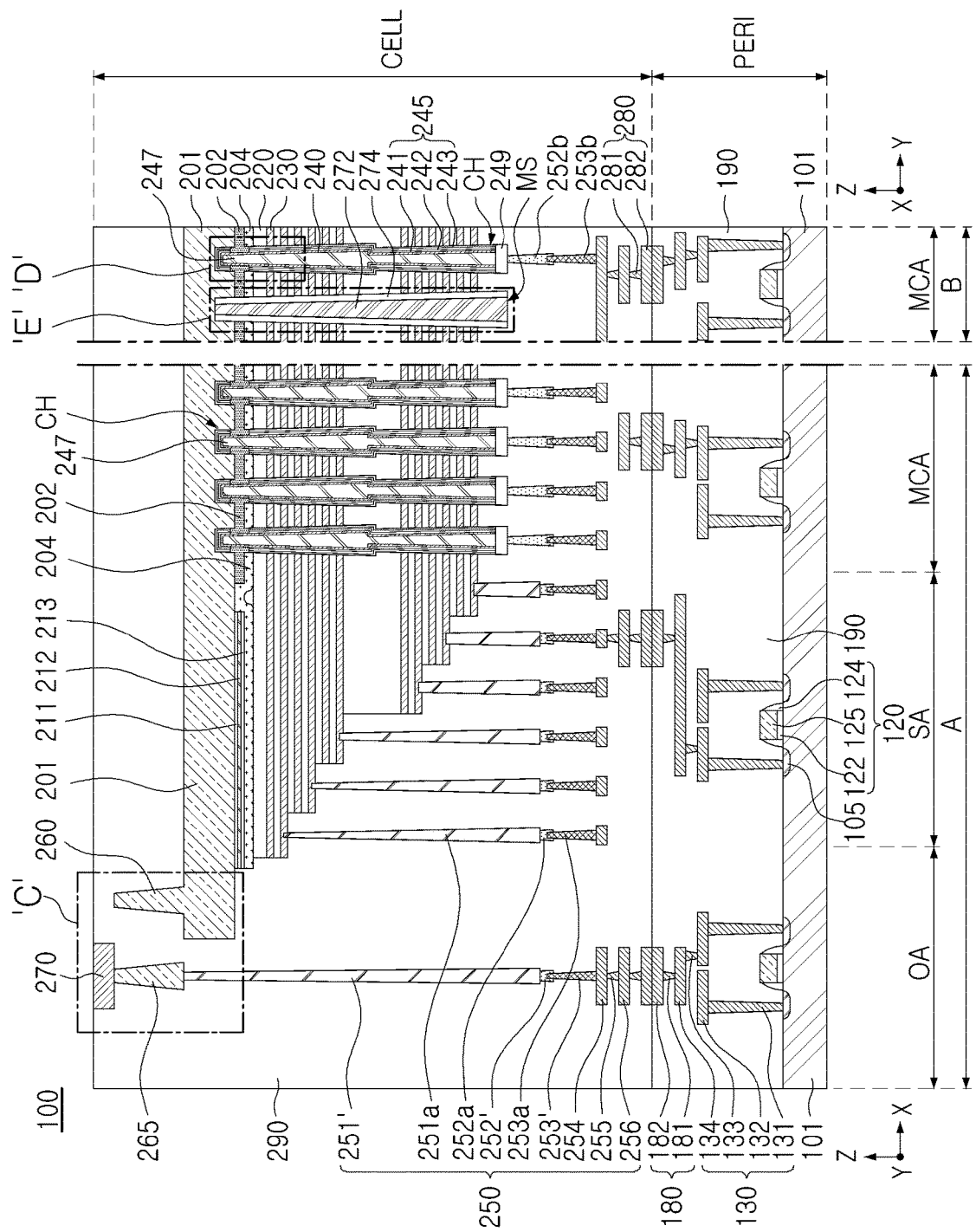
FIG. 2 is a cross-sectional view illustrating a semiconductor device according to example embodiments of the present disclosure.

Hereinafter, an example of the semiconductor device 100 will be described with reference to FIG. 2. In FIG. 2, region "A" may represent a cross-sectional structure of a portion of the memory cell array region MCA and the staircase region SA illustrated in FIG. 1 by cutting the semiconductor device 100 in the x direction. Also, region "B" may represent a cross-sectional structure of a portion of the memory cell array region MCA illustrated in FIG. 1 by cutting the semiconductor device 100 in the y direction.

FIG. 2 is a cross-sectional view illustrating a semiconductor device according to example embodiments.

Referring to FIG. 2, a semiconductor device 100 may include a peripheral circuit region PERI, a first semiconductor structure including a first substrate 101, and a memory cell region CELL, a second semiconductor structure including a second substrate 201. The memory cell region CELL may be disposed on the peripheral circuit region PERI. The peripheral circuit region PERI and the memory cell region CELL may be bonded to each other through lower and upper bonding structures 180 and 280. For example, the peripheral circuit region PERI and the memory cell region CELL may be bonded by copper (Cu)-copper (Cu) bonding.

The peripheral circuit region PERI may include a first substrate 101, source/drain regions 105 in the first substrate 101, circuit devices 120 disposed on the first substrate 101, a lower interconnection structure 130, a lower bonding structure 180, and a lower insulating layer 190.

The first substrate 101 may have an upper surface extending in the x direction and the y direction. An active region may be defined on the first substrate 101 by device separation layers. The source/drain regions 105 including impurities may be disposed in a portion of the active region. The first substrate may include a semiconductor material, such as a group IV semiconductor, a group III-V compound semiconductor, and/or a group II-VI compound semiconductor. The first substrate 101 may be provided as a bulk wafer or an epitaxial layer.

The circuit devices 120 may include planar transistors. Each of the circuit devices 120 may include a circuit gate dielectric layer 122, a spacer layer 124, and a circuit gate electrode 125. The source/drain regions 105 may be disposed in the first substrate 101 on both sides of the circuit gate electrode 125.

The lower interconnection structure 130 may be electrically connected to the circuit devices 120 and the source/drain regions 105. The lower interconnection structure 130 may include lower contact plugs 131 and 133 having a cylindrical shape and lower interconnection lines 132 and 134 having a line shape or extending in the x direction. The lower contact plugs 131 and 133 may include a first lower contact plug 131 and a second lower contact plug 133, and the lower interconnection lines 132 and 134 may include a first lower interconnection line 132 and a second lower interconnection line 134. The first lower contact plug 131 may be disposed on the circuit devices 120 and the source/drain regions 105, and the second lower contact plug 133 may be disposed on the first lower interconnection line 132. The first lower interconnection line 132 may be disposed on the first lower contact plug 131, and the second lower interconnection line 134 may be disposed on the second lower contact plug 133. The lower interconnection structure 130 may include a conductive material, such as, for example, tungsten (W), copper (Cu), aluminum (Al), and the like, and each of the elements may further include a diffusion barrier. However, in example embodiments, the number of layers and the arrangement forms of the lower contact plugs 131 and 133 and the lower interconnection lines 132 and 134 forming the lower interconnection structure 130 may be varied.

The lower bonding structure 180 may be connected to the lower interconnection structure 130. The lower bonding structure 180 may be connected to the upper bonding structure 280. The lower bonding structure 180 may include a lower bonding via 181 and a lower bonding pad 182, which may be a bonding layer. The lower bonding via 181 may be disposed on the second lower interconnection line 134. The lower bonding pad 182 may be disposed on the lower bonding via 181. The lower bonding structure 180 may include a conductive material, such as, for example, tungsten (W), copper (Cu), aluminum (Al), and the like, and each of the elements may further include a diffusion barrier. The lower bonding structure 180, together with the upper bonding structure 280, may provide an electrical connection path between the peripheral circuit region PERI and the memory cell region CELL.

The lower insulating layer 190 may be disposed on the circuit device 120 on the first substrate 101. The lower insulating layer 190 may include a plurality of insulating layers. The lower insulating layer 190 may be formed of an insulating material.

The memory cell region CELL may include a second substrate 201, first and second horizontal conductive layers 202 and 204 below the second substrate 201, gate electrodes 230 stacked below the second substrate 201, a separation region MS extending by penetrating the stack structure of the gate electrodes 230, channel structures CH disposed to penetrate the stack structure, an upper interconnection structure 250 electrically connected to the gate electrodes 230 and the channel structures CH, and an upper bonding structure 280 connected to the upper interconnection structure 250. The memory cell region CELL may include first to third horizontal sacrificial layers 211, 212, 213, interlayer insulating layers 220 alternately stacked with gate electrodes 230 below the second substrate 201, and an upper insulating layer 290 covering or overlapping the gate electrodes 230. The memory cell region CELL may further include a first via 260 connected to the second substrate 201 and configured as a "ground via", a second via 265 spaced apart from the second substrate 201 and configured as a "landing via", and a conductive pad 270 connected to the second via 265 and configured as an "input/output pad."

In the memory cell array region MCA, the gate electrodes 230 may be vertically stacked and channel structures CH may be disposed. In the staircase region SA, the gate electrodes 230 may extend by different lengths and may provide contact pads for electrically connecting the memory cells to the peripheral circuit region PERI. In the memory cell region CELL, a second via 265 may be disposed in an external side region OA of the memory cell array region MCA and the staircase region SA.

The second substrate 201 may include a semiconductor material, such as a group IV semiconductor, a group III-V compound semiconductor, and/or a group II-VI compound semiconductor, for example. For example, the group IV semiconductor may include silicon, germanium, or silicon-germanium. The second substrate 201 may further include impurities. The second substrate 201 may be provided as a polycrystalline semiconductor layer such as a polycrystalline silicon layer or an epitaxial layer.

The first and second horizontal conductive layers 202 and 204 may be stacked and disposed on a lower surface of the second substrate 201 in the memory cell array region MCA. The first horizontal conductive layer 202 may function as a portion of a common source line of the semiconductor device 100, and for example, the first horizontal conductive layer 202 may function as a common source line together with the second substrate 201. The first horizontal conductive layer 202 may be directly connected to the channel layer 240 around the channel layer 240. The first horizontal conductive layer 202 may penetrate the gate dielectric layer 245 and may be in contact with the channel layer 240. The first horizontal conductive layer 202 may not extend to the staircase region SA, and the second horizontal conductive layer 204 may also be disposed in the staircase region SA. The second horizontal conductive layer 204 may have substantially flat upper and lower surfaces in the memory cell array region MCA and the staircase region SA.

The first and second horizontal conductive layers 202 and 204 may include a semiconductor material, and may include, for example, polycrystalline silicon. In this case, at least the first horizontal conductive layer 202 may be a layer doped with the same impurities of the same conductivity as those of the second substrate 201, and the second horizontal conductive layer 204 may be a doped layer or may include impurities diffused from the first horizontal conductive layer 202. However, a material of the second horizontal conductive layer 204 is not limited to a semiconductor material, and may be replaced with an insulating layer.

The first to third horizontal sacrificial layers 211, 212, and 213 may be disposed below the second substrate 201 and side by side with the first horizontal conductive layer 202 in a portion of the staircase region SA. The first to third horizontal sacrificial layers 211, 212, and 213 may be stacked in order below the second substrate 201. The first to third horizontal sacrificial layers 211, 212, and 213 may be layers remaining after being partially replaced with the first horizontal conductive layer 202 in a process of manufacturing the semiconductor device 100. However, in example embodiments, the arrangement of the regions in the staircase region SA in which the first to third horizontal sacrificial layers 211, 212, and 213 remain may be varied.

The first and third horizontal sacrificial layers 211 and 213 and the second horizontal sacrificial layer 212 may include different insulating materials. The first and third horizontal sacrificial layers 211 and 213 may include the same material. For example, the first and third horizontal sacrificial layers 211 and 213 may be formed of the same material as that of the interlayer insulating layers 220, and the second horizontal sacrificial layer 212 may be formed of the same material as that of the sacrificial insulating layers 218 (see FIG. 10).

The gate electrodes 230 may be vertically stacked and spaced apart from each other below the second substrate 201 and may form a stack structure. The gate electrodes 230 may be disposed between the second substrate 201 and the upper interconnection structure 250. The gate electrodes 230 may include electrodes forming a ground select transistor, memory cells, and a string select transistor sequentially from the second substrate 201. The number of the gate electrodes 230 forming the memory cells may be determined according to storage capacity of the semiconductor device 100. In example embodiments, the number of the gate electrodes 230 forming the string select transistor and the ground select transistor may be one or two, and the gate electrodes 230 may have a structure the same as or different from that of the gate electrodes 230 of the memory cells. Also, the gate electrodes 230 may be disposed below the gate electrode 230 forming the string select transistor and above the gate electrode 230 forming the ground select transistor, and may further include a gate electrode 230 disposed above the gate electrode 230 forming the ground select transistor and forming an erasing transistor used for an erasing operation using a gate induced drain leakage (GIDL). Also, a portion of the gate electrodes 230, the gate electrodes 230 adjacent to the gate electrode 230 forming the string select transistor, and the ground select transistor, for example, may be dummy gate electrodes.

The gate electrodes 230 may be vertically stacked and spaced apart from each other in the memory cell array region MCA, and may extend by different lengths from the memory cell array region MCA to the staircase region SA and may form a stepped structure having a staircase shape. As illustrated in FIG. 2, the gate electrodes 230 may have a stepped structure in the x direction and may be disposed to have a stepped structure with each other in the y direction. Due to the stepped structure, the gate electrodes 230 may form a staircase shape in which the upper gate electrode 230 may extend longer than the lower gate electrode 230 and may provide ends exposed upwardly from the interlayer insulating layers 220. In example embodiments, on the ends, the gate electrodes 230 may have an increased thickness. Although not illustrated, a portion of the upper gate electrodes 230 may be separated by an upper separation region extending in the x direction.

The gate electrodes 230 may form a lower gate stack group and an upper gate stack group on the lower gate stack group. The interlayer insulating layer 220 disposed between the lower gate stack group and the upper gate stack group may have a relatively great thickness, but example embodiments thereof are not limited thereto. In FIG. 2, the example in which two stack groups of the gate electrodes 230 may be arranged vertically, but example embodiments thereof is not limited thereto, and the gate electrodes 230 may form a single stack group or a plurality of stack groups.

The gate electrodes 230 may include a metal material, such as, for example, tungsten (W) or aluminum (Al). In example embodiments, the gate electrodes 230 may include polycrystalline silicon or a metal silicide material. In example embodiments, the gate electrodes 230 may further include a diffusion barrier layer, and for example, the diffusion barrier layer may include tungsten nitride (WN), tantalum nitride (TaN), titanium nitride (TiN), or a combination thereof.

The interlayer insulating layers 220 may be disposed between the gate electrodes 230. Similarly to the gate electrodes 230, the interlayer insulating layers 220 may be spaced apart from each other in a direction perpendicular to a lower surface of the second substrate 201 and may be disposed to extend in the x direction. The interlayer insulating layers 220 may include an insulating material such as silicon oxide or silicon nitride.

The separation regions MS may be disposed to penetrate the gate electrodes 230 and to extend in the x direction in the memory cell array region MCA and the staircase region SA. The separation regions MS may penetrate the gate electrodes 230 that are stacked below the second substrate 201 and may be connected to the second substrate 201. The separation regions MS may have a shape in which a width decreases toward the second substrate 201 due to a high aspect ratio. The separation regions MS may extend in the x direction and may separate the gate electrodes 230 from each other in the y direction. The separation regions MS may include a conductive layer 272 and a separation insulating layer 274. The separation insulating layer 274 may cover or overlap side surfaces of the conductive layer 272. The conductive layer 272 may be connected to the second substrate 201. The separation insulating layer 274 may include an insulating material such as silicon oxide or silicon nitride, and the conductive layer 272 may include a conductive material, such as, for example, tungsten (W), copper (Cu), aluminum (Al), and/or the like.

Each of the channel structures CH may form a single memory cell string, and may be spaced apart from each other while forming rows and columns on the memory cell array region MCA. The channel structures CH may be disposed to form a grid pattern on the x-y plane or may be disposed in a zigzag pattern in one direction. The channel structures CH may have a columnar shape, and may have inclined side surfaces of which the width decreases toward the second substrate 201 due to an aspect ratio.

Each of the channel structures CH may have a form in which the lower and upper channel structures penetrate the lower gate stack group and the upper gate stack group of the gate electrodes 230 are connected to each other, and may have a bent portion with a difference or a change in width in a connection region.

The channel layer 240 may be disposed in the channel structures CH. The channel layer 240 of the lower channel structure and the channel layer 240 of the upper channel structure may be connected to each other. In the channel structures CH, the channel layer 240 may be formed in an annular shape surrounding the core insulating layer 247, but in example embodiments, the channel layer 240 may be configured to have a cylindrical shape such as a columnar shape or a prism shape without the core insulating layer 247. The channel layer 240 may be connected to the first horizontal conductive layer 202 on an upper portion. The channel layer 240 may include a semiconductor material such as polycrystalline silicon or single crystal silicon.

Channel pads 249 may be disposed below the channel layer 240 in the channel structures CH. The channel pads 249 may be disposed to cover or overlap a lower surface of the core insulating layer 247 and to be electrically connected to the channel layer 240. The channel pads 249 may include, for example, doped polycrystalline silicon.

The gate dielectric layer 245 may be disposed between the gate electrodes 230 and the channel layer 240. The gate dielectric layer 245 may include a tunneling layer 241, a data storage layer 242, and a blocking layer 243 stacked from the channel layer 240 in order. The tunneling layer 241 may tunnel charges to the data storage layer 242, and may include, for example, silicon oxide ($SiO_2$), silicon nitride ($Si_3N_4$), silicon oxynitride (SiON), or a combination thereof. The data storage layer 242 may be a charge trap layer or a floating gate conductive layer. The blocking layer 243 may include silicon oxide ($SiO_2$), silicon nitride ($Si_3N_4$), silicon oxynitride (SiON), a high-k dielectric material, or a combination thereof. In example embodiments, at least a portion of the gate dielectric layer 245 may extend in a horizontal direction along the gate electrodes 230.

The upper interconnection structure 250 may be electrically connected to the gate electrodes 230 and the channel layers 240 of the channel structures CH. The upper interconnection structure 250 may include a contact plug 251' having a columnar shape, connection contacts 252' and 253', gate contacts 251a, 252a and 253a, channel contacts 252b and 253b, and an upper contact plug 255, and may further include upper interconnection lines 254 and 256 having a linear shape. The gate contacts 251a, 252a, and 253a may include a first gate contact 251a, a second gate contact 252a on the first gate contact 251a, and a third gate contact 253a on the second gate contact 252a. The channel contacts 252b and 253b may include a first channel contact 252b and a second channel contact 253b. The upper interconnection lines 254 and 256 may include a first upper interconnection line 254 and a second upper interconnection line 256. The contact plug 251' may be electrically connected to the upper interconnection lines 254 and 256 through the connection contacts 252' and 253' disposed therebelow.

The contact plug 251' may be directly connected to the second via 265 in the external side region OA. The contact plug 251' may have, for example, a columnar shape, and may have a width decreasing toward an upper portion depending on an aspect ratio. For example, a width of an upper end of the contact plug 251' may be smaller than a width of a lower end. For example, a width of the contact plug 251' may decrease toward the conductive pad 270 or from the first substrate 101.

The gate contacts 251*a*, 252*a*, and 253*a* may be connected to the gate electrodes 230 in the staircase region SA. The gate contacts 251*a*, 252*a*, and 253*a* may penetrate at least a portion of the upper insulating layer 290 and may be disposed to be connected to each of the gate electrodes 230 exposed downwardly. The channel contacts 252*b* and 253*b* may be electrically connected to the channel layer 240 through the channel pads 249 of the channel structures CH in the memory cell array region MCA.

The first upper interconnection line 254 may be disposed below the third gate contact 253*a* and the second channel contact 253*b*, and the second upper interconnection line 256 may be disposed below the upper contact plug 255. The upper contact plug 255 may be disposed below the first upper interconnection line 254. The upper interconnection structure 250 may include a conductive material, such as, for example, tungsten (W), copper (Cu), aluminum (Al), and the like, and each of the elements may further include a diffusion barrier. However, in example embodiments, the number of layers and the arrangement form of the contacts 251*a*, 252*a*, 252*b*, 253*a*, 253*b*, and 255 and the upper interconnection lines 254 and 256 forming the upper interconnection structure 250 may be varied.

The first via 260 may be a bypass via. The first via 260 may prevent arcing by grounding the second substrate 201 and the second horizontal conductive layer 204 during the process of manufacturing the semiconductor device 100. Although partially illustrated in FIG. 2, a plurality of the first vias 260 may be disposed and may be spaced apart from each other by a predetermined distance in a direction, for example, in the y direction in the semiconductor device 100. The first via 260 may extend in a z direction spacing apart from the gate electrodes 230 from an upper portion of the second substrate 201 or in a direction opposite to a direction in which the gate electrodes 230 are stacked from the second substrate 201. The first via 260 may be integrated with the second substrate 201 and may include the same semiconductor material as that of the second substrate 201. The first via 260 may include impurities of the same conductivity as that of the second substrate 201. A diameter of the first via 260 may be smaller in an upper portion than in a lower portion. For example, the first via 260 may include a portion of which a width may decrease away from the upper surface of the second substrate 201. However, in example embodiments, the first via 260 may not be provided.

The second via 265 may be a landing via which may allow an end of the contact plug 251' to be disposed in the second via 265 when the contact plug 251' is formed in the external side region OA. The upper end of the contact plug 251' may be in direct contact with the second via 265. The upper end of the second via 265 may be disposed on a level higher than a level of the lower surface of the second substrate 201 in a direction of being away from the first substrate 101. The second via 265 may be formed in the same process of forming the first via 260 and may have a structure corresponding to the first via 260. The term "corresponding structure" may indicate that the element may be formed by the same manufacturing method and may have substantially the same shape. The second via 265 may be disposed on substantially the same level as that of the first via 260. The second via 265 may be disposed to horizontally overlap the first via 260, and may be disposed side by side with the first via 260. The second via 265 may be disposed to be physically spaced apart from the second substrate 201. The second via 265 may be disposed on the external side region OA, an external side of the gate electrodes 230 or an external side of the second substrate 201, for example. A width of a lower portion of the second via 265 may be greater than a width of an upper portion of the second via 265.

By disposing the contact plug 251' to land directly on and contact the second via 265 formed together with the first via 260 in the external side region OA, a process of forming an input/output landing pad and a process of forming a via for connecting the input/output landing pad to the conductive pad 270 may not be performed, such that the process of manufacturing the semiconductor device may be simplified and manufacturing costs may be reduced.

The first via 260 and the second via 265 may include a semiconductor material, such as, for example, at least one of silicon (Si) and germanium (Ge). The first via 260 and the second via 265 may be formed of a doped semiconductor material including impurities. The first via 260 and the second via 265 may include impurities of the same conductivity as that of the second substrate 201. For example, the first via 260, the second via 265, and the second substrate 201 may include at least one of boron (B), aluminum (Al), gallium (Ga), and indium (In), which may be P-type dopants, or may include at least one of phosphorus (P), arsenic (As), and antimony (Sb), which may be N-type dopants.

The conductive pad 270 may be an input/output pad of the semiconductor device 100 and may be electrically connected to a controller. The conductive pad 270 may be in contact with the upper portion of the second via 265. The conductive pad 270 may be electrically connected to the circuit devices 120 disposed in the peripheral circuit region PERI.

The upper bonding structure 280 may be connected to the upper interconnection structure 250. The upper bonding structure 280 may be connected to the lower bonding structure 180. The upper bonding structure 280 may include an upper bonding via 281 and an upper bonding pad 282 which may be a bonding layer. The upper bonding via 281 may be disposed below the second upper interconnection line 256. The upper bonding pad 282 may be disposed below the upper bonding via 281. The upper bonding structure 280 may include a conductive material, such as, for example, tungsten (W), copper (Cu), aluminum (Al), and the like, and each of the elements may further include a diffusion barrier.

The upper insulating layer 290 may be disposed to cover or overlap the second substrate 201, the gate electrodes 230 below the second substrate 201, and the lower insulating layer 190. The upper insulating layer 290 may include a plurality of insulating layers. The upper insulating layer 290 may be formed of an insulating material.

Figure 3:
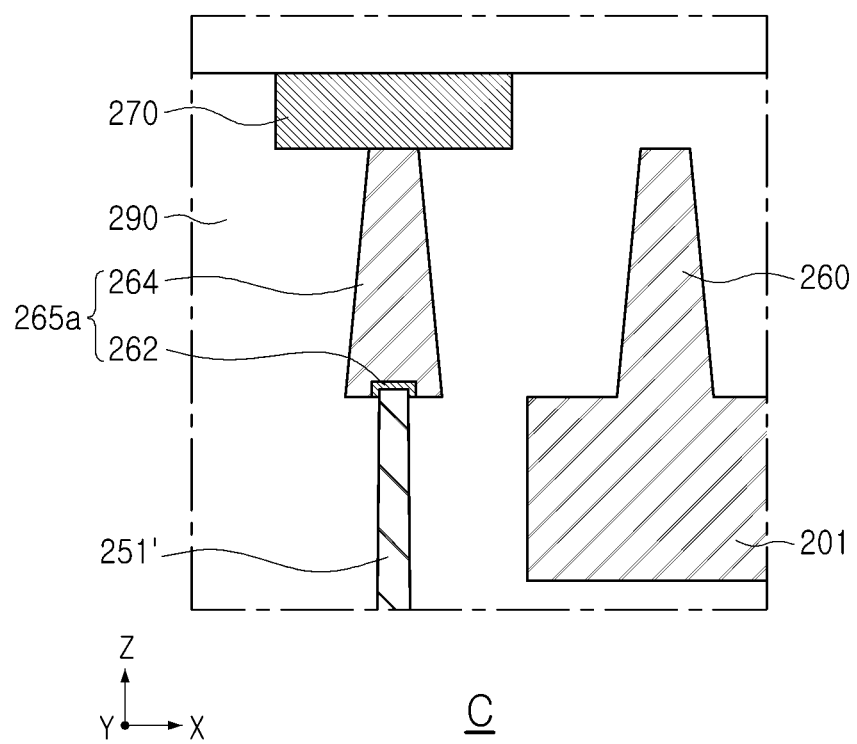
FIG. 3 is an enlarged view illustrating a portion of a semiconductor device according to example embodiments of the present disclosure.

FIG. 3 is an enlarged view illustrating a portion of a semiconductor device according to an example embodiment, illustrating a region corresponding to region "C" in FIG. 2.

Referring to FIG. 3, a second via 265*a* of a semiconductor device 100*a* may include a metal-semiconductor compound layer 262 and a semiconductor layer 264. The metal-semiconductor compound layer 262 may be disposed to surround a portion of an upper region of the contact plug 251' between the contact plug 251' and the semiconductor layer 264. The metal-semiconductor compound layer 262 may include, for example, a metal silicide, a metal germanide, or a metal silicide-germanide. In the metal-semiconductor compound layer 262, the metal may be titanium (Ti), nickel (Ni), tantalum (Ta), cobalt (Co), or tungsten (W), and the semiconductor may be silicon (Si), germanium (Ge), and silicon germanium (SiGe). For example, the metal-semiconductor compound layer 262 may include at least one of cobalt silicide (CoSi), titanium silicide (TiSi), nickel silicide (NiSi), and tungsten silicide (WSi). Since the second via 265a may include the metal-semiconductor compound layer 262, contact resistance between the semiconductor layer 264 and the contact plug 251' may be lowered.

Figure 4:
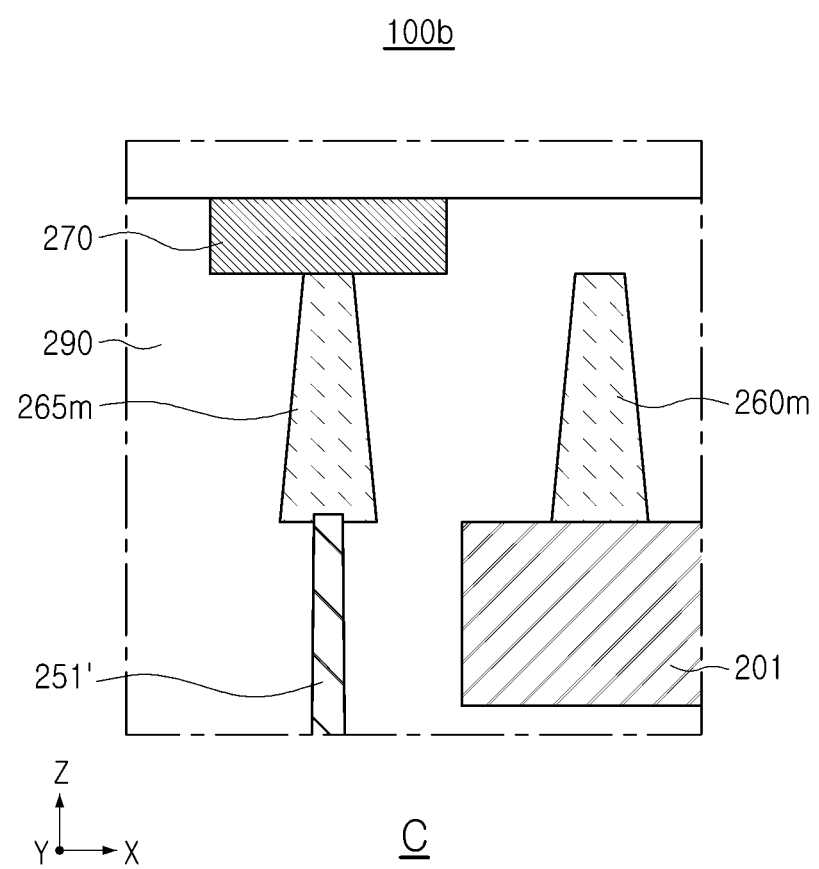
FIG. 4 is an enlarged view illustrating a portion of a semiconductor device according to example embodiments of the present disclosure.

FIG. 4 is an enlarged view illustrating a portion of a semiconductor device according to example embodiments, illustrating a region corresponding to region "C" in FIG. 2.

Referring to FIG. 4, a first via 260m and a second via 265m of a semiconductor device 100b may include a material different from that of the second substrate 201. For example, the first via 260m and the second via 265m may include a metal material such as, for example, aluminum (Al), copper (Cu), tungsten (W), cobalt (Co), ruthenium (Ru), and molybdenum (Mo), and may include at least one of metal nitrides such as titanium nitride (TiN), tantalum nitride (TaN), and tungsten nitride (WN). Since the second via 265m may include a metal material, contact resistance between the second via 265m and the contact plug 251' may be reduced. The first via 260m may not be integrated with the second substrate 201, and the first via 260m may be formed preferentially, a planarization process may be performed, and then the second substrate 201 may be formed. In this case, a boundary between the first via 260m and the second substrate 201 may be distinct.

Figure 5:
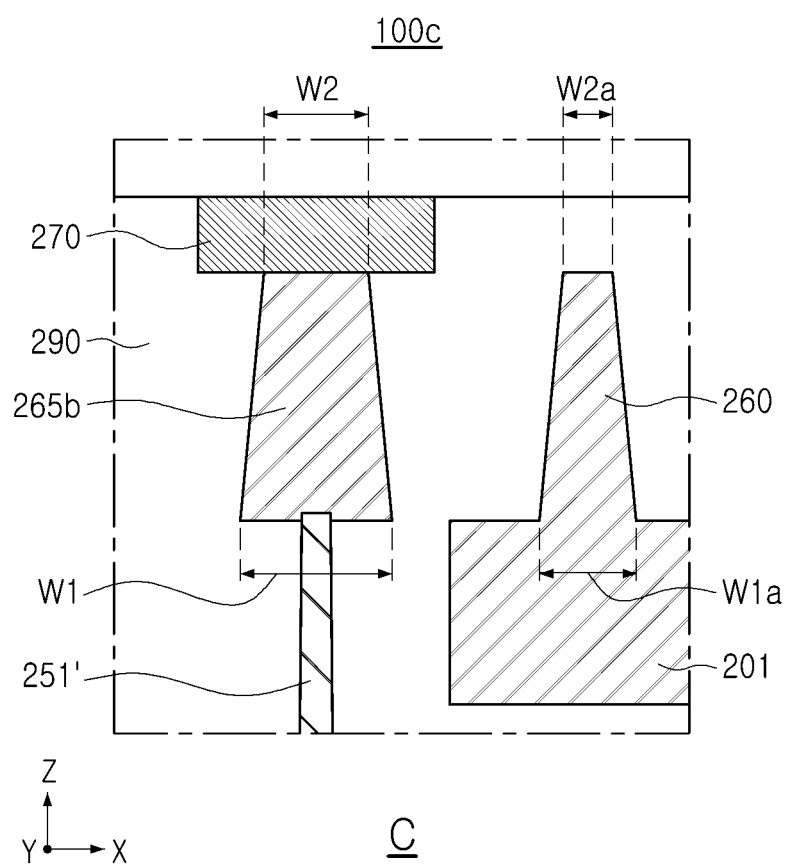
FIG. 5 is an enlarged view illustrating a portion of a semiconductor device according to example embodiments of the present disclosure.

FIG. 5 is an enlarged view illustrating a portion of a semiconductor device according to example embodiments of the present disclosure, illustrating a region corresponding to region "C" in FIG. 2.

Referring to FIG. 5, a second via 265b of a semiconductor device 100c may have a size larger than that of the first via 260. For example, the second via 265b may have a width greater than that of the first via 260. A width W1 of a lower surface of the second via 265b may be larger than a width W1a of a lower surface of the first via 260. A width W1 of a lower surface of the second via 265b may be greater than a width W2 of an upper surface, and a width W1a of a lower surface of the first via 260 may be greater than a width W2a of an upper surface. By increasing the width of the second via 265b, even when the contact plug 251' is misaligned, the contact plug 251' may stably land on the second via 265b, and a semiconductor device having improved reliability may be provided.

Figure 6:
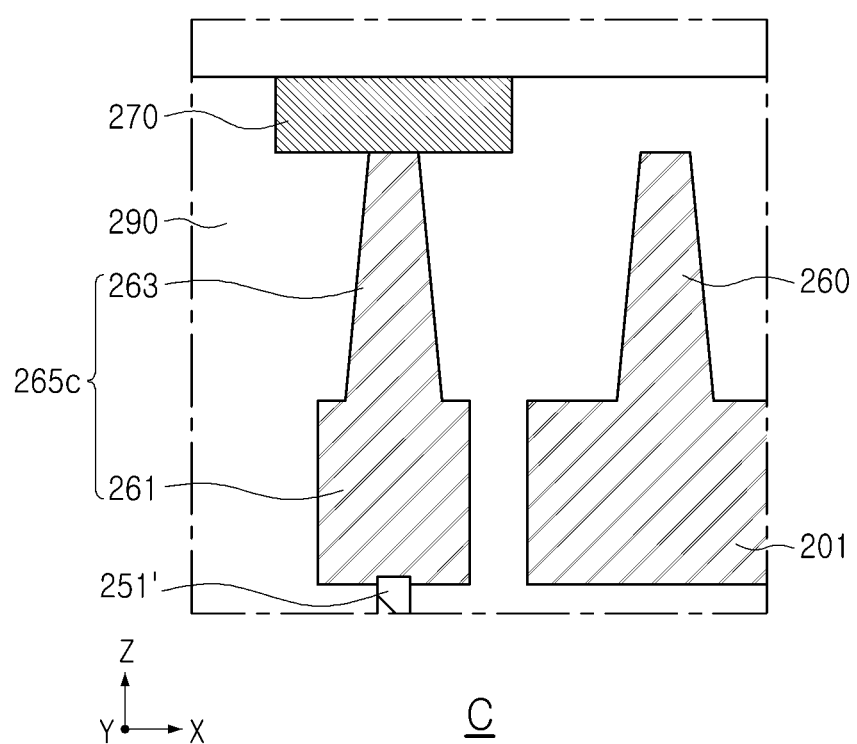
FIG. 6 is an enlarged view illustrating a portion of a semiconductor device according to example embodiments of the present disclosure.

FIG. 6 is an enlarged view illustrating a portion of a semiconductor device according to example embodiments, illustrating a region corresponding to region "C" in FIG. 2.

Referring to FIG. 6, a second via structure 265c of a semiconductor device 100d may include a first pattern portion 261 and a second pattern portion 263. The first pattern portion 261 may be disposed on the same level as that of the second substrate 201, and the second pattern portion 263 may be disposed on the same level as that of the first via 260. In example embodiments, the term "substantially the same" may indicate that the configuration may be the same or there may be a difference in deviation occurring in the manufacturing process, and even when the term "substantially" is omitted, the above term may be interpreted the same. The first pattern portion 261 and the second pattern portion 263 may be integrated and may include the same semiconductor material. The first pattern portion 261 may be a region formed together with the second substrate 201. The contact plug 251' may land on the first pattern portion 261. A lower surface of the first pattern portion 261 may have a width greater than a width of the second pattern portion 263, and the contact plug 251' may stably land on the second via structure 265c. For example, the metal-semiconductor compound layer 262 in FIG. 3 described above may be disposed between the first pattern portion 261 and the contact plug 251'.

Figure 7:
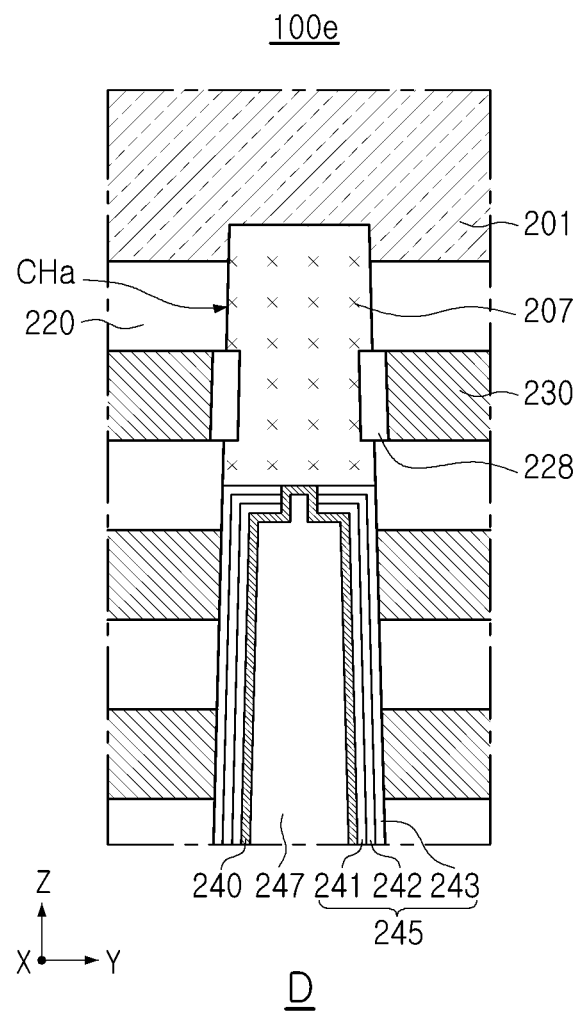
FIG. 7 is an enlarged view illustrating a portion of a semiconductor device according to example embodiments of the present disclosure.

FIG. 7 is an enlarged view illustrating a portion of a semiconductor device according to example embodiments, illustrating a region corresponding to region "D" in FIG. 2.

Referring to FIG. 7, in a semiconductor device 100e, differently from the example embodiment in FIG. 2, the memory cell region CELL may not include the first and second horizontal conductive layers 202 and 204 disposed below the second substrate 201. Also, the channel structure CHa may further include an epitaxial layer 207.

The epitaxial layer 207 may be disposed to be in contact with the second substrate 201 on an upper end of the channel structure CHa, and may be disposed on a side surface of at least one of the gate electrodes 230. The epitaxial layer 207 may be disposed in a recessed region of the second substrate 201. A level of a lower surface of the epitaxial layer 207 may be higher than a level of a lower surface of the lowermost gate electrode 230 and may be lower than a level of an upper surface of the lower gate electrode 230 disposed therebelow, but example embodiments thereof is not limited thereto. The epitaxial layer 207 may be connected to the channel layer 240 through a lower surface. A gate insulating layer 228 may be further disposed between the epitaxial layer 207 and a gate electrode 230 in contact with the epitaxial layer 207.

Figure 8:
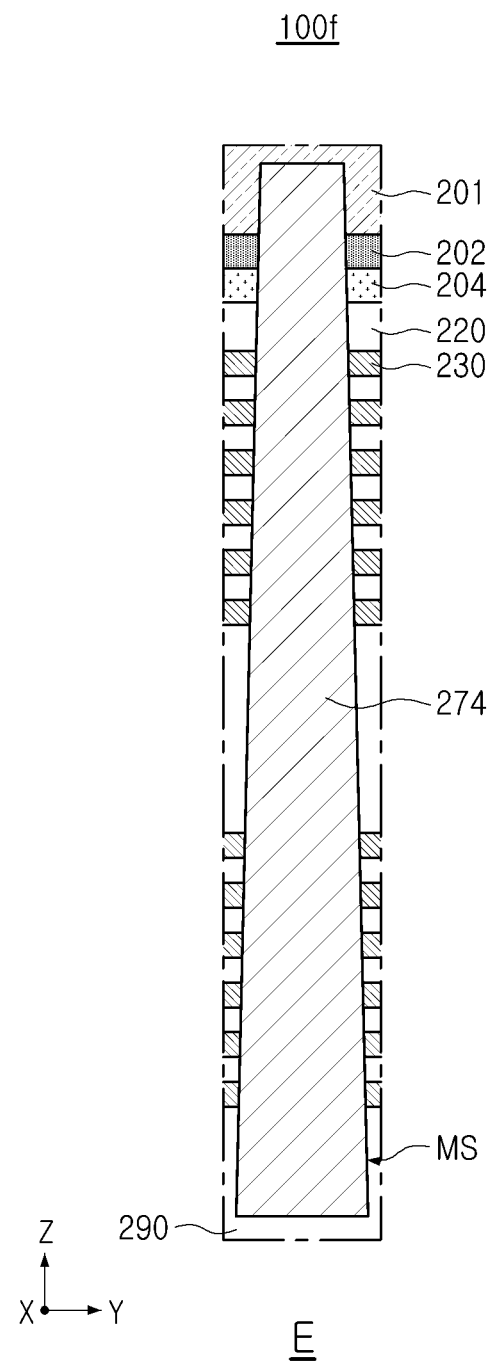
FIG. 8 is an enlarged view illustrating a portion of a semiconductor device according to example embodiments of the present disclosure.

FIG. 8 is an enlarged view illustrating a portion of a semiconductor device according to example embodiments, illustrating a region corresponding to region "E" in FIG. 2.

Referring to FIG. 8, in a semiconductor device 100f, differently from the example embodiment in FIG. 2, the separation region MS may not include the conductive layer 272, and may only include the separation insulating layer 274 including an insulating material such as silicon oxide or silicon nitride.

FIGS. 9 to 15 are cross-sectional views illustrating a method of manufacturing a semiconductor device according to example embodiments, illustrating regions corresponding to the regions illustrated in FIG. 2.

Figure 9:
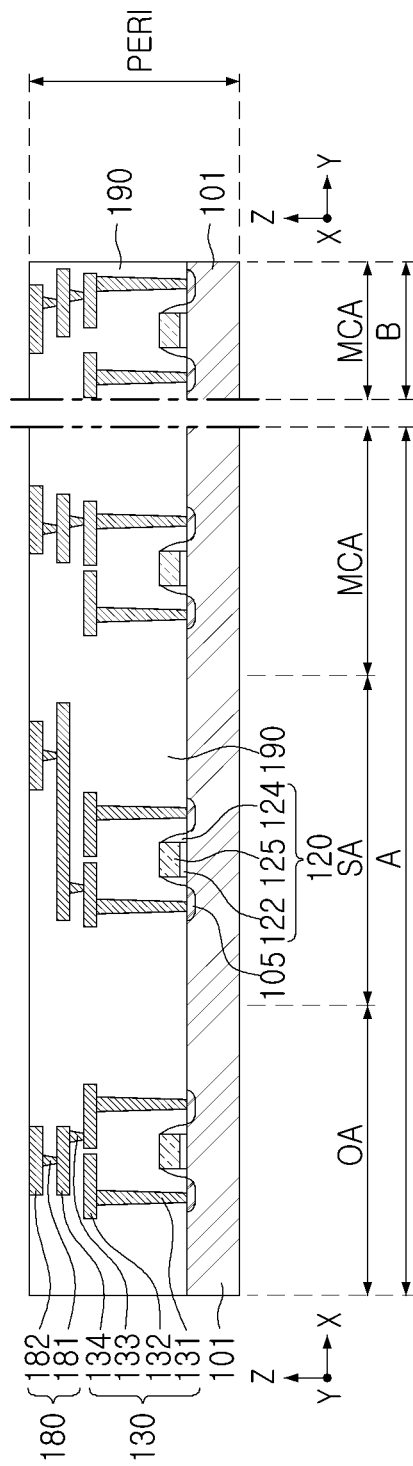
FIGS. 9 to 15 are cross-sectional views illustrating a method of manufacturing a semiconductor device according to example embodiments of the present disclosure.

Referring to FIG. 9, circuit devices 120, lower interconnection structures 130, and lower bonding structures 180 may form a peripheral circuit region PERI on a first substrate 101.

Device separation layers may be formed in the first substrate 101, and a circuit gate dielectric layer 122 and a circuit gate electrode 125 may be formed in order on the first substrate 101. The device separation layers may be formed by, for example, a shallow trench separation (STI) process. The circuit gate dielectric layer 122 and the circuit gate electrode 125 may be formed using atomic layer deposition (ALD) or chemical vapor deposition (CVD). The circuit gate dielectric layer 122 may be formed of silicon oxide, and the circuit gate electrode 125 may be formed of at least one of polysilicon or metal silicide layers, but example embodiments thereof is not limited thereto. Thereafter, a spacer layer 124 and source/drain regions 105 may be formed on both sidewalls of the circuit gate dielectric layer 122 and the circuit gate electrode 125. In example embodiments, a plurality of the spacer layers 124 may be provided.

Lower contact plugs 131 and 133 of a lower interconnection structure 130 may be formed by forming a portion of the lower insulating layer 190, removing a portion thereof by etching, and filling a conductive material. The lower interconnection lines 132 and 134 may be formed by depositing a conductive material and patterning the conductive material.

A lower bonding via 181 of a lower bonding structure 180 may be formed by forming a portion of the lower insulating layer 190, removing a portion thereof by etching, and filling a conductive material. A lower bonding pad 182 may be formed by depositing a conductive material and patterning the conductive material. The lower bonding structure 180 may be formed by, for example, a deposition process or a plating process. When the bonding layer is formed by a plating process, a seed layer may be formed, according to some embodiments.

A lower insulating layer 190 may include a plurality of insulating layers. A portion of the lower insulating layer 190 may be formed in each of processes of forming the lower interconnection structure 130 and the lower bonding structure 180. Accordingly, a peripheral circuit region PERI may be formed.

Figure 10:
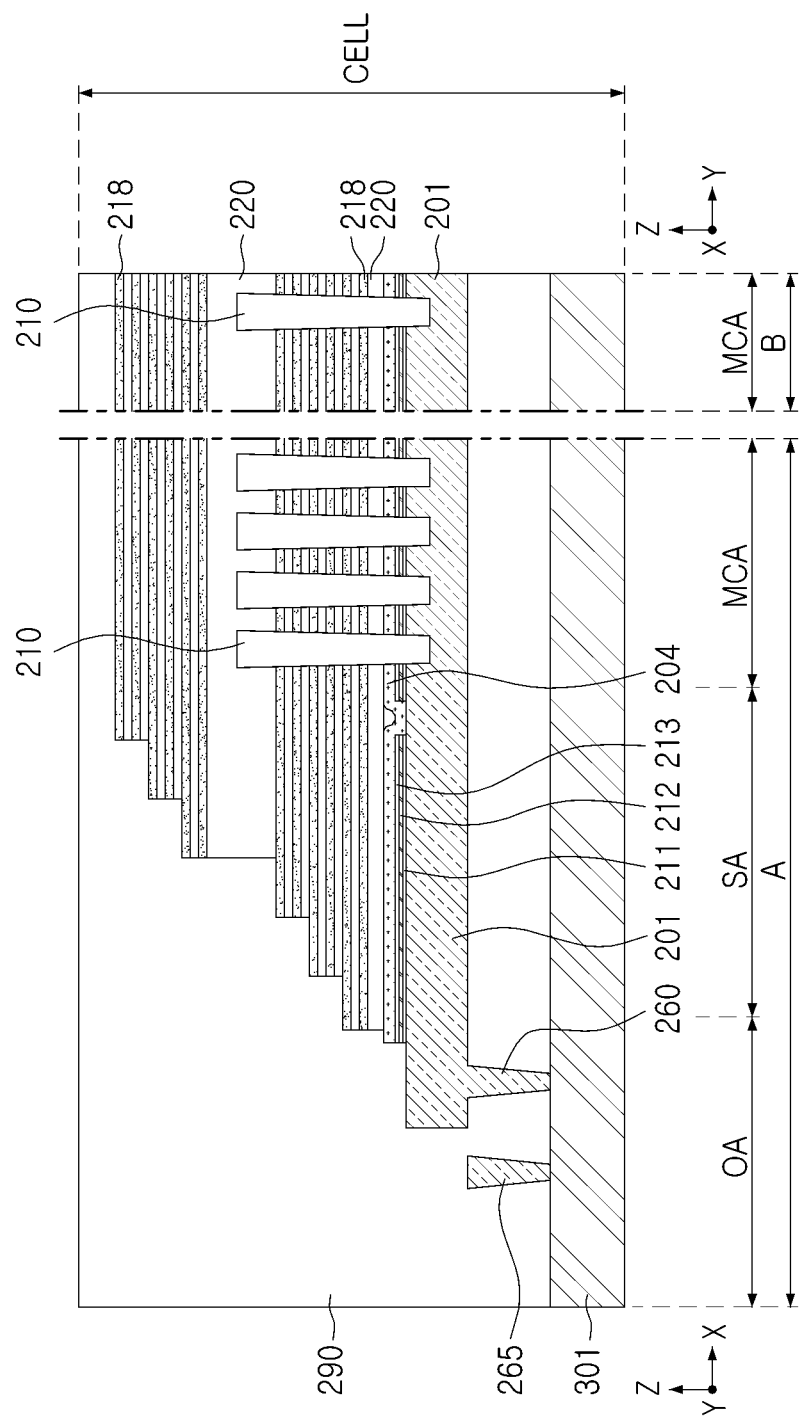

Referring to FIG. 10, a first via 260 and a second via 265 may be formed on the base substrate 301, a second substrate 201, first to third horizontal sacrificial layers 211, 212, and 213, and a second horizontal conductive layer 204 may be formed, and sacrificial insulating layers 218 and interlayer insulating layers 220 may be alternately stacked.

A portion of the upper insulating layer 290 may be formed on a base substrate 301, and the first via 260 and the second via 265, penetrating therethrough, may be formed. The base substrate 301 may include a semiconductor material, such as a group IV semiconductor, a group III-V compound semiconductor, and/or a group II-VI compound semiconductor. The base substrate 301 may be provided to control a thickness of the second substrate 201 in a process of removing the base substrate 301. For example, a portion of the upper insulating layer 290 may be disposed between the base substrate 301 and the second substrate 201. The first via 260 and the second via 265 may be formed by forming via holes penetrating a portion of the upper insulating layer 290 and filling a semiconductor material therein. When the via holes are configured to have different sizes, the semiconductor device 100c in FIG. 5 may be manufactured. The second via 265 may be spaced apart from the second substrate 201 and may be formed in the external side region OA to work as a landing via rather than a ground via.

The second substrate 201 may be integrated with the first via 260 in the process of forming the first and second vias 260 and 265, or may be formed in a process separate from the process of forming the first and second vias 260 and 265. For example, the second substrate 201 may be formed by at least partially or completely filling a metal material in the via holes of the first and second vias 260 and 265 and performing a planarization process, thereby manufacturing the semiconductor device 100b in FIG. 4. For example, after the via holes are formed, the via holes may be at least partially or completely filled with a semiconductor material while forming a semiconductor pattern included in the second substrate 201, and the semiconductor pattern may be partitioned as the second substrate 201 connected to the first via 260 and a first pattern portion 261 connected to the second pattern portion 263 of the second via structure 265d, as illustrated in FIG. 6.

Thereafter, the second substrate 201 may be formed, and first to third horizontal sacrificial layers 211, 212, and 213 and a second horizontal conductive layer 204 may be formed on the second substrate 201. The second substrate 201 may be spaced apart from the base substrate 301 by a portion of the upper insulating layer 290. The first to third horizontal sacrificial layers 211, 212, and 213 may be stacked in order on the second substrate 201. The first to third horizontal sacrificial layers 211, 212, and 213 may be replaced by the first horizontal conductive layer 202 in FIG. 2, which may be formed through a subsequent process, in the memory cell array region MCA. The second horizontal conductive layer 204 may be formed on the third horizontal sacrificial layer 213.

The sacrificial insulating layers 218 may be partially replaced with gate electrodes 230 (see FIG. 2) through a subsequent process. The sacrificial insulating layers 218 may be formed of a material different from that of the interlayer insulating layers 220, and may be formed of a material etched with etch selectivity for the interlayer insulating layers 220 under specific etching conditions. For example, the interlayer insulating layer 220 may be formed of at least one of silicon oxide and silicon nitride, and the sacrificial insulating layers 218 may be formed of a material different from that of the interlayer insulating layer 220, selected from among silicon, silicon oxide, silicon carbide, and/or silicon nitride. In example embodiments, thicknesses of the interlayer insulating layers 220 may not be the same. The thicknesses of the interlayer insulating layers 220 and the sacrificial insulating layers 218 and the number of layers thereof may be varied from the illustrated examples.

A photolithography process and an etching process may be repeatedly performed on the sacrificial insulating layers 218 using a mask layer such that the upper sacrificial insulating layers 218 may extend shorter than the lower sacrificial insulating layers 218 in the staircase region SA. Accordingly, the sacrificial insulating layers 218 may form a stepped structure in a staircase shape by a predetermined unit.

Thereafter, a vertical sacrificial layer 210 may be formed in a lower channel hole penetrating the lower stack structures of the sacrificial insulating layers 218 and the interlayer insulating layer 220. The lower channel hole may be formed by performing anisotropically etching the lower stack structure of the sacrificial insulating layers 218 and the interlayer insulating layers 220 after forming the lower stack structure of the sacrificial insulating layers 218 and the interlayer insulating layer 220. Thereafter, the upper stack structure of the sacrificial insulating layers 218 and the interlayer insulating layers 220 may be formed on the lower stack structure.

Thereafter, an upper insulating layer 290 covering or overlapping the stack structure of the sacrificial insulating layers 218 and the interlayer insulating layers 220 may be formed.

Figure 11:
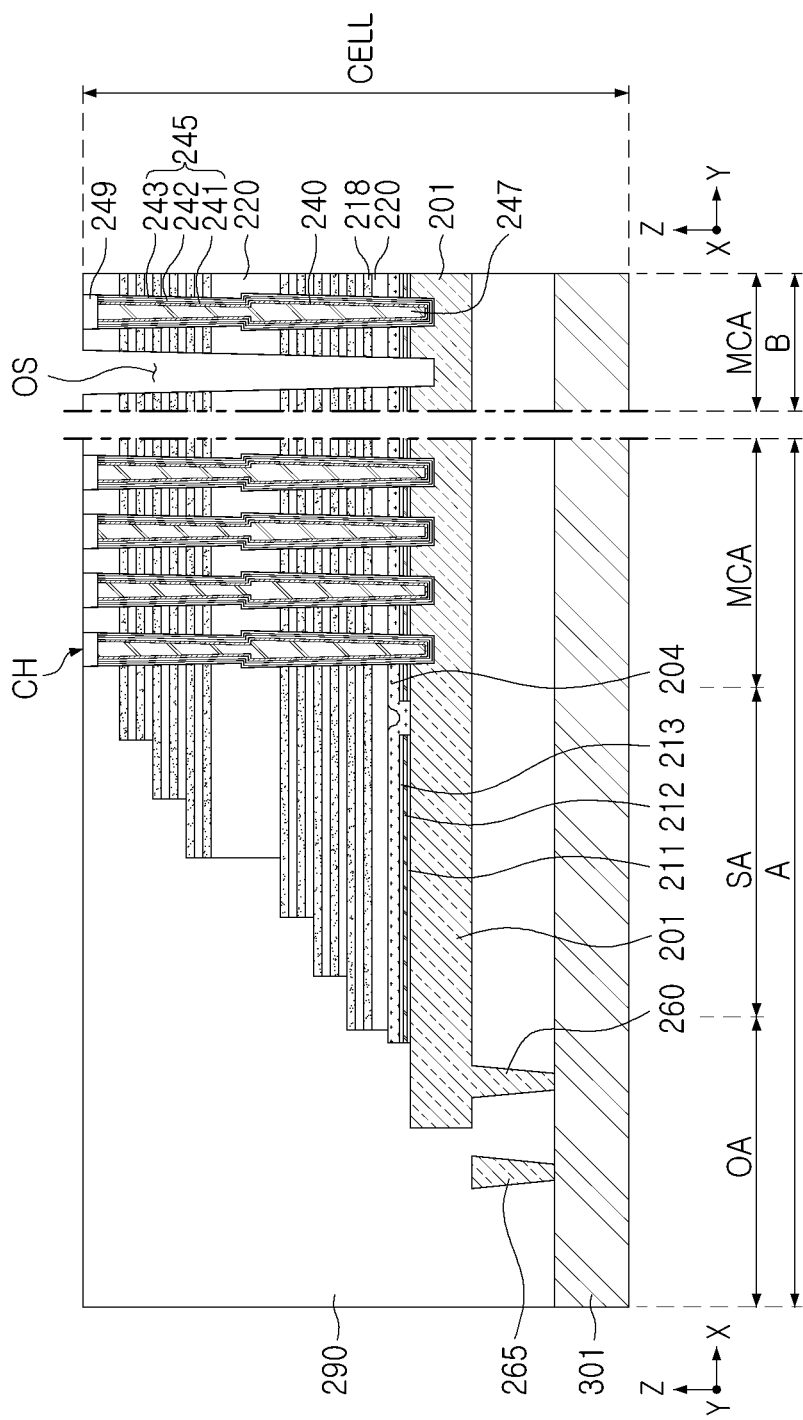

Referring to FIG. 11, channel structures CH penetrating the stack structure of the sacrificial insulating layers 218 and the interlayer insulating layers 220 may be formed. In regions corresponding to the separation regions MS (see FIG. 2), openings OS penetrating the stack structure of the sacrificial insulating layers 218 and the interlayer insulating layers 220 may be formed.

The channel structures CH may be formed by at least partially or completely filling channel holes having a hole shape with the layers of the channel structures CH. The channel holes may include the lower channel hole and an upper channel hole extending from the lower channel hole. The upper channel hole may be formed by anisotropically etching the upper stack structures of the sacrificial insulating layers 218 and the interlayer insulating layers 220. The lower channel hole may be formed by removing the vertical sacrificial layer 210 through the upper channel hole penetrating the upper stack structure of the sacrificial insulating layers 218 and the interlayer insulating layer 220. The gate dielectric layer 245, a channel layer 240, a core insulating layer 247, and a channel pad 249 may be formed in the lower channel hole and the upper channel hole. When a plasma dry etching process is used to form the channel holes, a potential difference may occur in the upper and lower portions of the channel holes due to ions formed in the channel holes. However, since the second horizontal conductive layer 204 and the second substrate 201 are connected to the base substrate 301 by the first via 260, positive charges may flow to the base substrate 301, and negative charges moved through the mask layer may flow from an edge of a wafer to the base substrate 301, for example, such that arcing defects caused by a potential difference may be prevented.

Due to a height of the stack structure, sidewalls of the channel structures CH may not be perpendicular to the upper surface of the second substrate 201. The channel structures CH may be formed to be recessed into a portion of the second substrate 201.

The gate dielectric layer 245 may be formed to have a uniform thickness using an ALD or CVD process. In this process, a gate dielectric layer 245 or a portion of the gate dielectric layer 245 may be formed, and a portion extending perpendicularly to the second substrate 201 along the channel structures CH may be formed in this process. The channel layer 240 may be formed on the gate dielectric layer 245 in the channel structures CH. The core insulating layer 247 may be formed to fill the channel structures CH, and may be an insulating material. The channel pad 249 may be formed of a conductive material, such as, for example, polycrystalline silicon.

Thereafter, the openings OS may penetrate the stack structure of the sacrificial insulating layers 218 and the interlayer insulating layers 220, and may penetrate the second horizontal conductive layer 204 and the first to third horizontal sacrificial layers 211, 212, and 213 in a lower portion.

Figure 12:
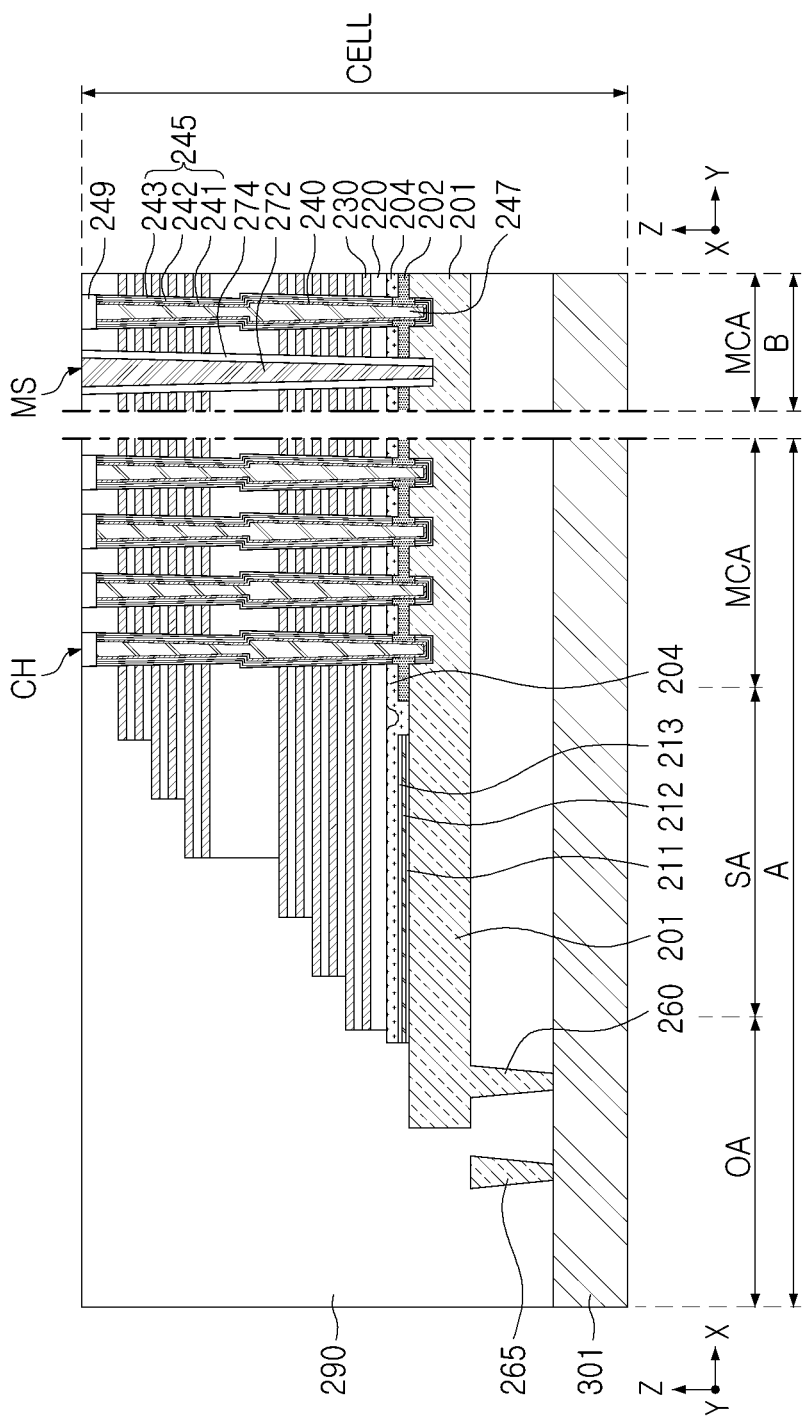

Referring to FIG. 12, the sacrificial insulating layers 218 may be removed through the openings OS, and the gate electrodes 230 may be formed.

While sacrificial spacer layers may be formed in the openings, the second horizontal sacrificial layer 212 may be exposed by an etch-back process. The second horizontal sacrificial layer 212 may be selectively removed from the region exposed in the memory cell array region MCA, and the first and third horizontal sacrificial layers 211 and 213 disposed above and below the horizontal sacrificial layer 212 may be removed.

The first to third horizontal sacrificial layers 211, 212, and 213 may be removed by, for example, a wet etching process. In the process of removing the first and third horizontal sacrificial layers 211 and 213, a portion of the gate dielectric layer 245 exposed in the region from which the second horizontal sacrificial layer 212 is removed may also be removed. The first horizontal conductive layer 202 may be formed by depositing a conductive material in the region from which the first to third horizontal sacrificial layers 211, 212, and 213 are removed, and the sacrificial spacer layers may be removed from the openings. By this process, the first horizontal conductive layer 202 may be formed in the memory cell array region MCA, and the first to third horizontal sacrificial layers 211, 212, and 213 may remain in the staircase region SA.

Thereafter, tunnel portions may be formed by removing the sacrificial insulating layers 218 through the openings OS, and the gate electrodes 230 may be formed by filling the tunnel portions with a conductive material. The conductive material may include a metal, polycrystalline silicon, or metal silicide material. After the gate electrodes 230 are formed, the conductive material deposited in the openings may be removed through an additional process, and the region may be filled with an insulating material and a conductive material, thereby forming a separation insulating layer 274 and a conductive layer 272 (see FIG. 2).

Figure 13:
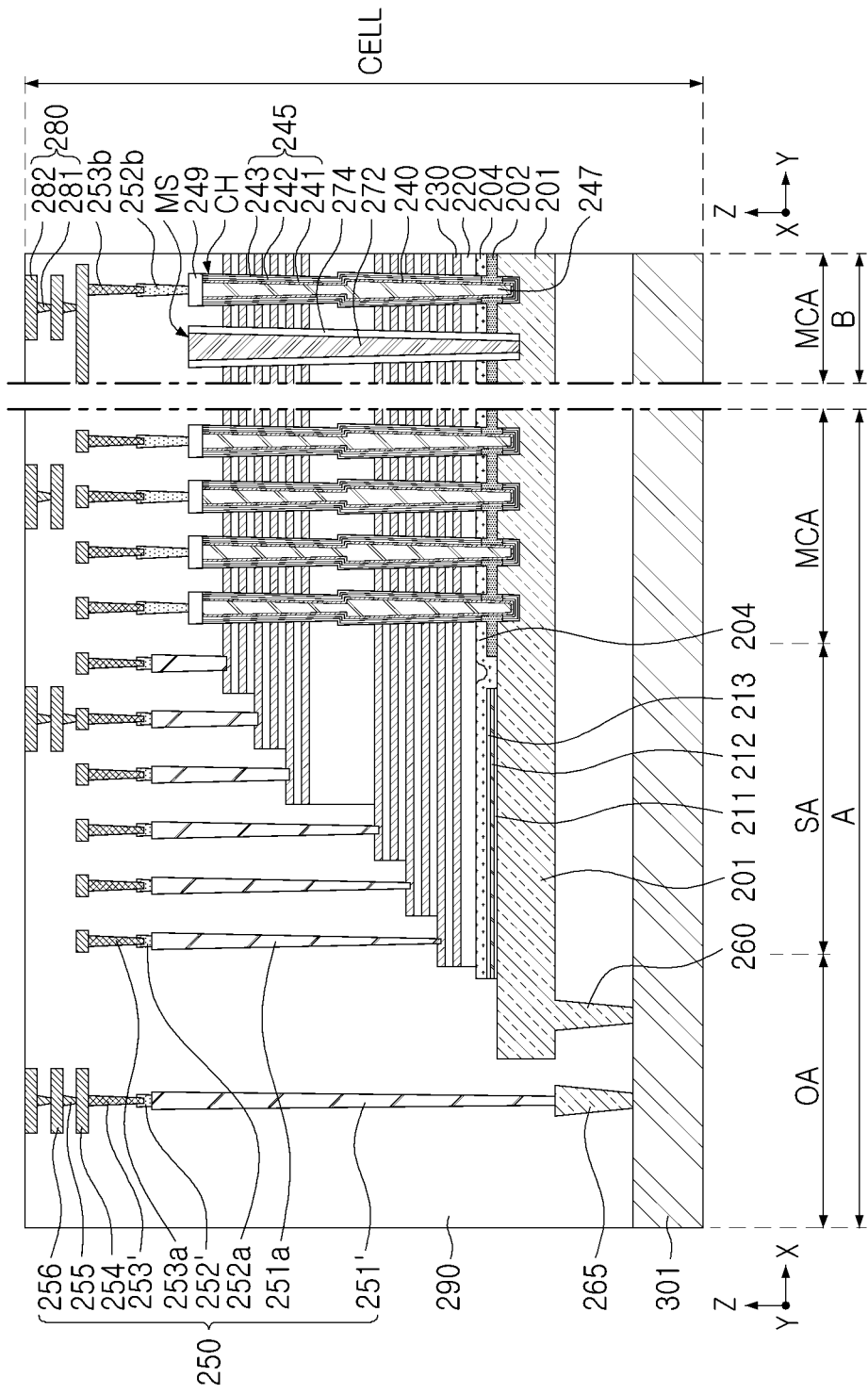

Referring to FIG. 13, gate contacts 251a, 252a, and 253a, channel contacts 252b and 253b, upper contact plug 255, upper interconnection lines 254 and 256, a contact plug 251', and the upper bonding structure 280 may be formed.

The first gate contact 251a of the gate contacts 251a, 252a, and 253a may be configured to be connected to the gate electrodes 230 in the staircase region SA, and the first channel contact 252b of the channel contacts 252b and 253b may be configured to be connected to the channel pad 249.

The gate contacts 251a, 252a, and 253a, the channel contacts 252b and 253b, the upper contact plug 255, the upper interconnection lines 254 and 256, and the contact plug 251' may be configured to have different depths, and may be formed by simultaneously forming contact holes using an etch stop layer and filling the contact holes with a conductive material. However, in example embodiments, a portion of the gate contacts 251a, 252a, and 253a, the channel contacts 252b and 253b, the upper contact plug 255, the upper interconnection lines 254 and 256, and the contact plug 251' may be formed in different processes.

Thereafter, the upper bonding structure 280 may be formed by a method similar to the method of forming the lower bonding structure 180 of FIG. 2 and/or FIG. 9. Accordingly, the memory cell region CELL may be formed. However, in the process of manufacturing the semiconductor device, the memory cell region CELL may further include the base substrate 301.

Figure 14:
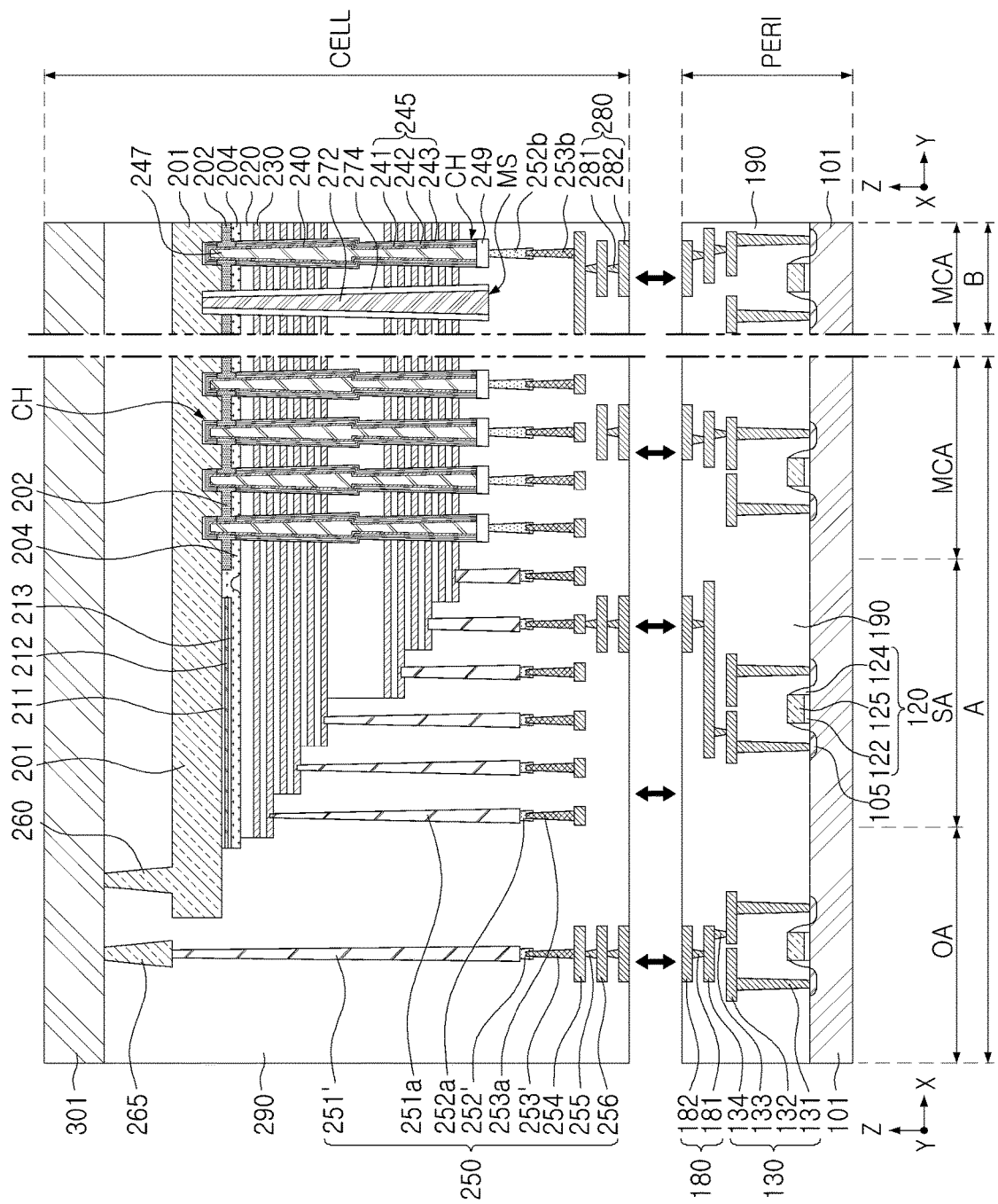

Referring to FIG. 14, a peripheral circuit region PERI, including a first substrate structure, and a memory cell region CELL, including a second substrate structure, may be bonded to each other.

The peripheral circuit region PERI and the memory cell region CELL may be connected by bonding the lower bonding pad 182 and the upper bonding pad 282 by pressing. The memory cell region CELL on the peripheral circuit region PERI may be disposed to be upside down and may be bonded such that the upper bonding pad 282 may be directed downwardly. The peripheral circuit region PERI and the memory cell region CELL may be directly bonded without interposing an adhesive, such as a separate adhesive layer, therebetween.

Figure 15:
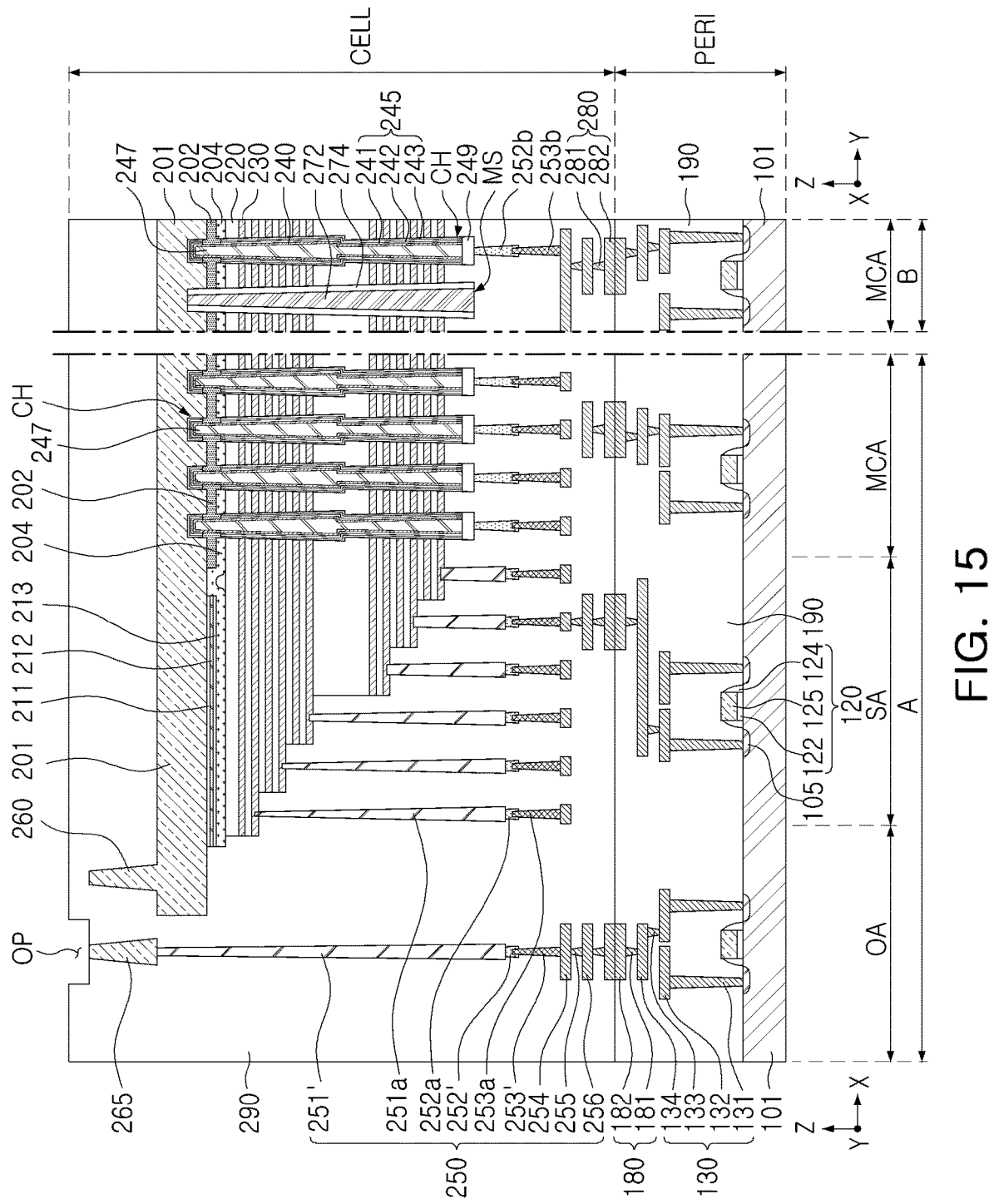

Referring to FIG. 15, an opening OP exposing the second via 265 may be formed by removing the base substrate 301 and patterning a portion of the upper insulating layer 290.

The base substrate 301 may be removed by, for example, a polishing process such as a grinding process. Accordingly, upper surfaces of the first via 260 and the second via 265 may be exposed.

Thereafter, a portion of the upper insulating layer 290 may be additionally formed on the first and second vias 260 and 265, and the upper insulating layer 290 may be patterned, thereby forming the opening OP. When the opening OP is formed, a portion of the upper region of the second via 265 may be removed. In this case, a level of the upper end of the first via 260 may be different from a level of the upper end of the second via 265. However, example embodiments thereof is not limited thereto. Thereafter, the conductive pad 270 (illustrated in FIGS. 2-6) may be formed in the opening OP, thereby forming the semiconductor device 100 in FIG. 2.

Figure 16:
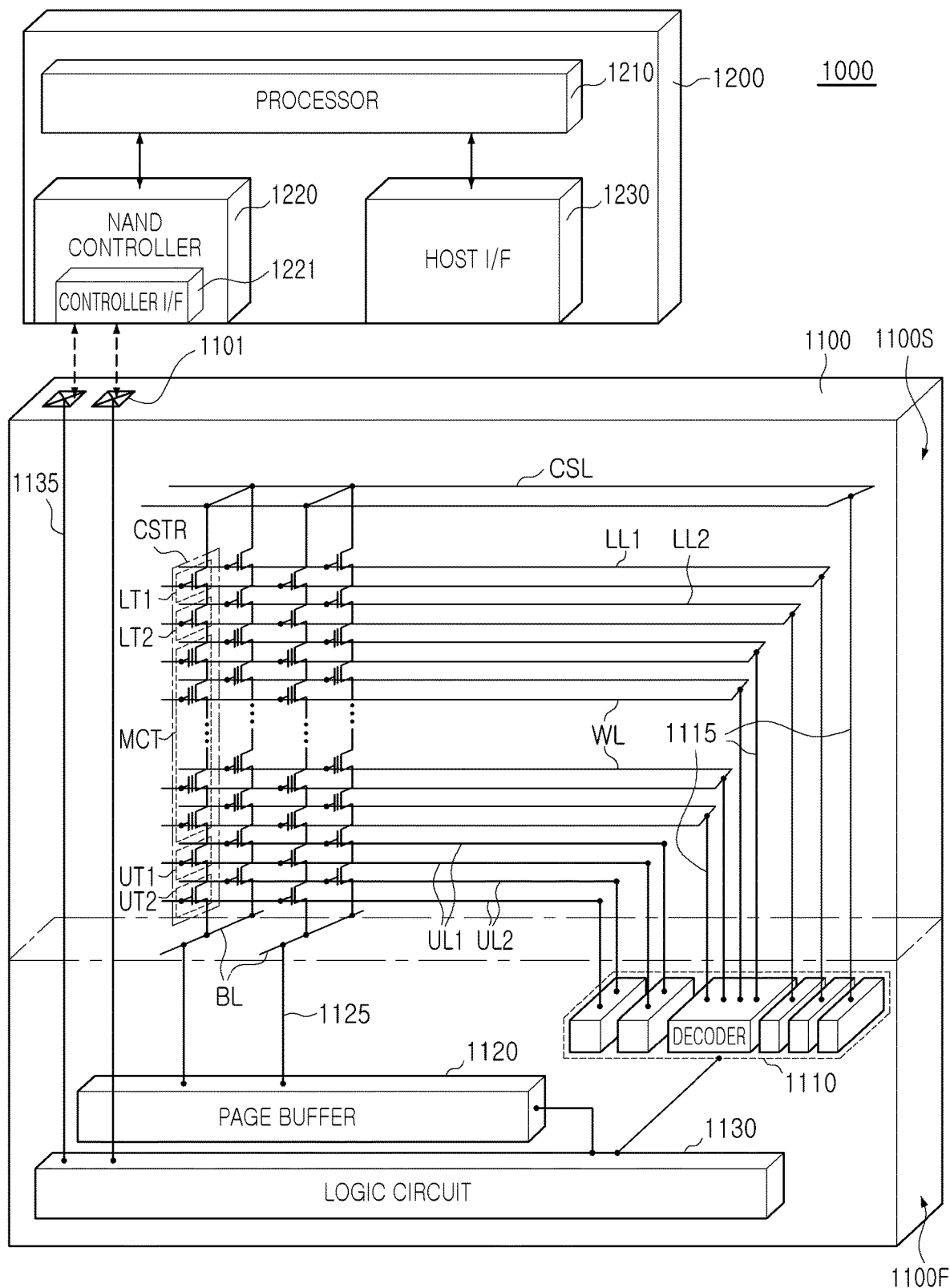
FIG. 16 is a view illustrating a data storage system including a semiconductor device according to example embodiments of the present disclosure.

FIG. 16 is a view illustrating a data storage system including a semiconductor device according to example embodiments.

Referring to FIG. 16, a data storage system 1000 may include a semiconductor device 1100 and a controller 1200 electrically connected to the semiconductor device 1100. The data storage system 1000 may be implemented by a storage device including one or more semiconductor devices 1100 or an electronic device including the storage device. For example, the data storage system 1000 may be implemented by a solid state drive device (SSD) including one or more semiconductor devices 1100, a universal serial bus (USB), a computing system, a medical device, or a communication device.

The semiconductor device 1100 may be implemented as a nonvolatile memory device, and may be implemented as, for example, the NAND flash memory device described in the aforementioned example embodiments with reference to FIGS. 1 to 12C. The semiconductor device 1100 may include a first structure 1100F and a second structure 1100S on the first structure 1100F. In example embodiments, the first structure 1100F may be disposed adjacent to the second structure 1100S. The first structure 1100F may be implemented as a peripheral circuit structure including a decoder circuit 1110, a page buffer 1120, and a logic circuit 1130. The second structure 1100S may be implemented as a memory cell structure including a bit line BL, common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in example embodiments.

In example embodiments, the upper transistors UT1 and UT2 may include a string select transistor, and the lower transistors LT1 and LT2 may include a ground select transistor. The lower gate lines LL1 and LL2 may be configured as gate electrodes of the lower transistors LT1 and LT2, respectively. The word lines WL may be configured as gate electrodes of the memory cell transistors MCT, and the upper gate lines UL1 and UL2 may be configured as gate electrodes of the upper transistors UT1 and UT2, respectively.

In example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection lines 1115 extending from the first structure 1100F to the second structure 1100S. The bit lines BL may be electrically connected to the page buffer 1120 through second connection lines 1125 extending from the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input and output pad 1101 electrically connected to the logic circuit 1130. The input and output pad 1101 may be electrically connected to the logic circuit 1130 through an input and output connection interconnection 1135 extending from the first structure 1100F to the second structure 1100S.

The controller 1200 may include a processor 1210, a NAND controller 1220, and a host interface 1230. In example embodiments, the data storage system 1000 may include a plurality of semiconductor devices 1100, and in this case, the controller 1200 may control the plurality of semiconductor devices 1100.

The processor 1210 may control overall operations of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Through the NAND interface 1221, a control command for controlling the semiconductor device 1100, data to be written in the memory cell transistors MCT of the semiconductor device 1100, and data to be read from the memory cell transistors MCT may be transmitted. The host interface 1230 may provide a communication function between the data storage system 1000 and an external host. When a control command is received from an external host through the host interface 1230, the processor 1210 may control the semiconductor device 1100 in response to the control command.

Figure 17:
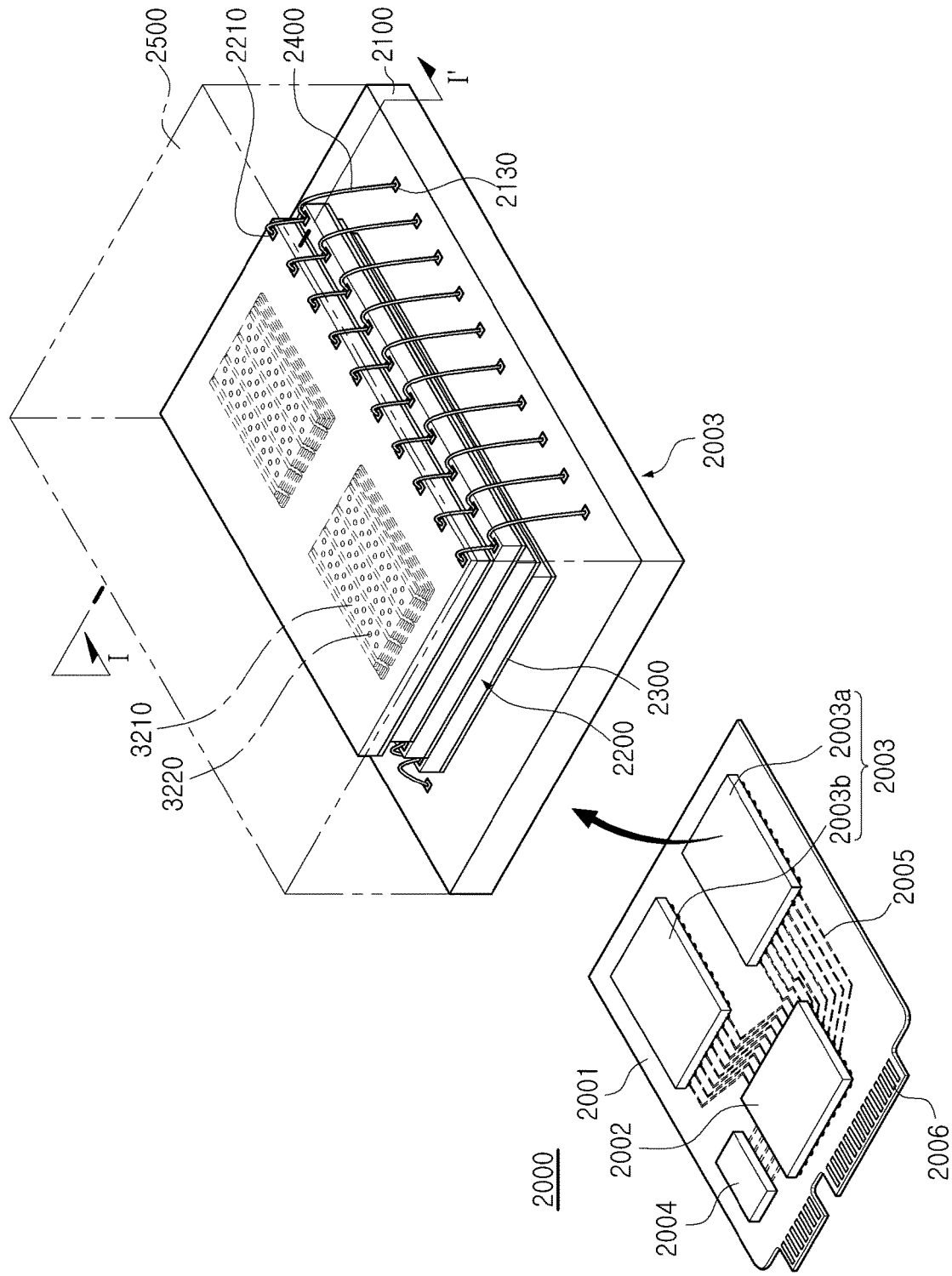
FIG. 17 is a perspective view illustrating a data storage system including a semiconductor device according to example embodiments of the present disclosure.

FIG. 17 is a perspective view illustrating a data storage system including a semiconductor device according to example embodiments.

Referring to FIG. 17, a data storage system 2000 in an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main board or main substrate 2001 may include a connector 2006 including a plurality of pins coupled to an external host. The number and the arrangement of the plurality of pins in the connector 2006 may be varied depending on a communication interface between the data storage system 2000 and an external host. In example embodiments, the data storage system 2000 may communicate with an external host according to one of interfaces such as universal serial bus (USB), peripheral component interconnect express (PCI-Express), serial advanced technology attachment (SATA), M-Phy for universal flash storage (UFS), and the like. In example embodiments, the data storage system 2000 may be operated by power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be implemented as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, and adhesive layers 2300 disposed on a lower surface of each of the semiconductor chips 2200, a connection structure 2400 electrically connecting the semiconductor chips 2200 to the package substrate 2100, and a molding layer 2500 covering or overlapping the semiconductor chips 2200 and the connection structure 2400 on the package substrate 2100.

The package substrate 2100 may be configured as a printed circuit board including the package upper pads 2130. Each semiconductor chip 2200 may include an input and output pad 2210. The input and output pad 2210 may correspond to the input and output pad 1101 in FIG. 16 and may include the conductive pad 270 in FIG. 2. Each of the semiconductor chips 2200 may include gate stack structures 3210 and channel structures 3220. Each of the semiconductor chips 2200 may include the semiconductor device described in the aforementioned example embodiment with reference to FIGS. 1 to 8.

In example embodiments, the connection structure 2400 may be configured as a bonding wire electrically connecting the input and output pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In example embodiments, in each of the first and second semiconductor packages 2003a and 2003b, the semiconductor chips 2200 may be electrically connected to each other by a connection structure including a through silicon via (TSV), instead of the connection structure 2400 of a bonding wire type.

In example embodiments, the controller 2002 and the semiconductor chips 2200 may be included in a single package. In an example embodiment, the controller 2002 and the semiconductor chips 2200 may be mounted on an interposer substrate separate from the main substrate 2001, and the controller 2002 may be connected to the semiconductor chips 2200 by an interconnection formed on the interposer substrate.

Figure 18:
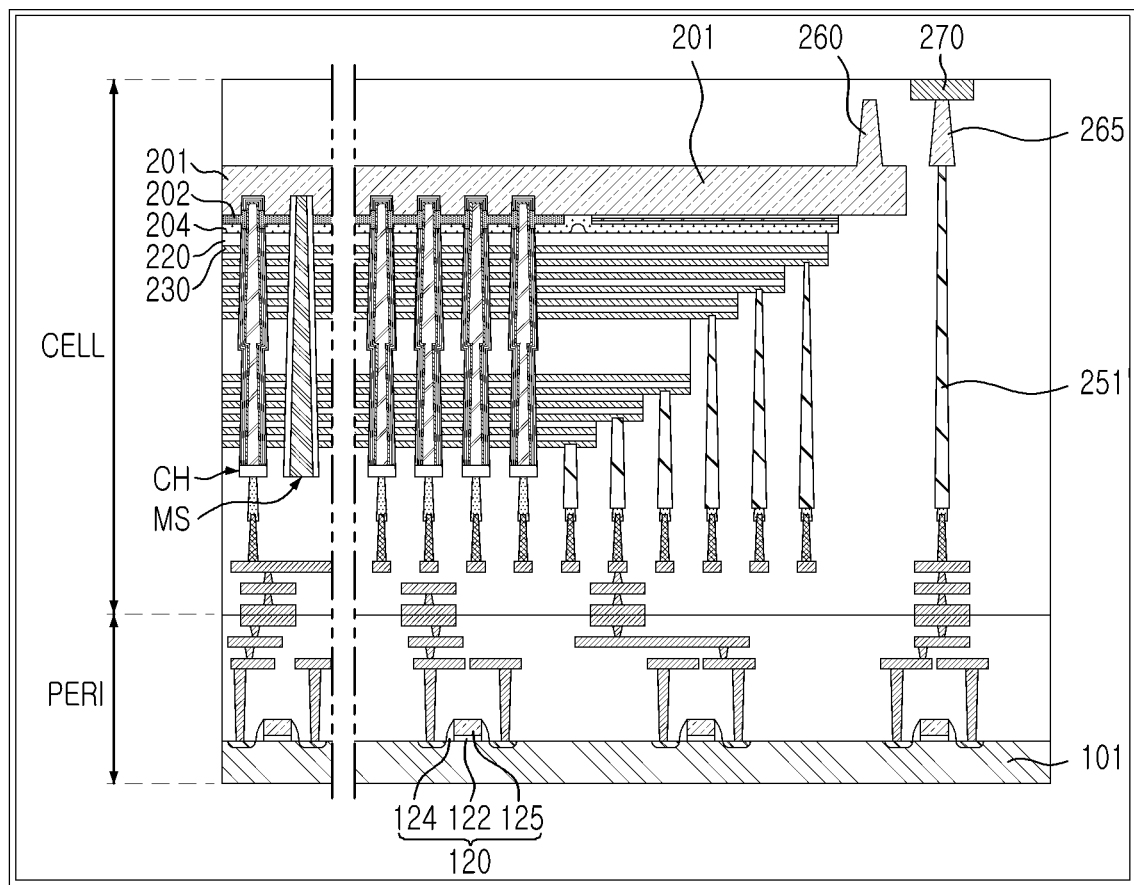
FIG. 18 is a cross-sectional view illustrating a semiconductor package according to example embodiments of the present disclosure.
Figure 18:
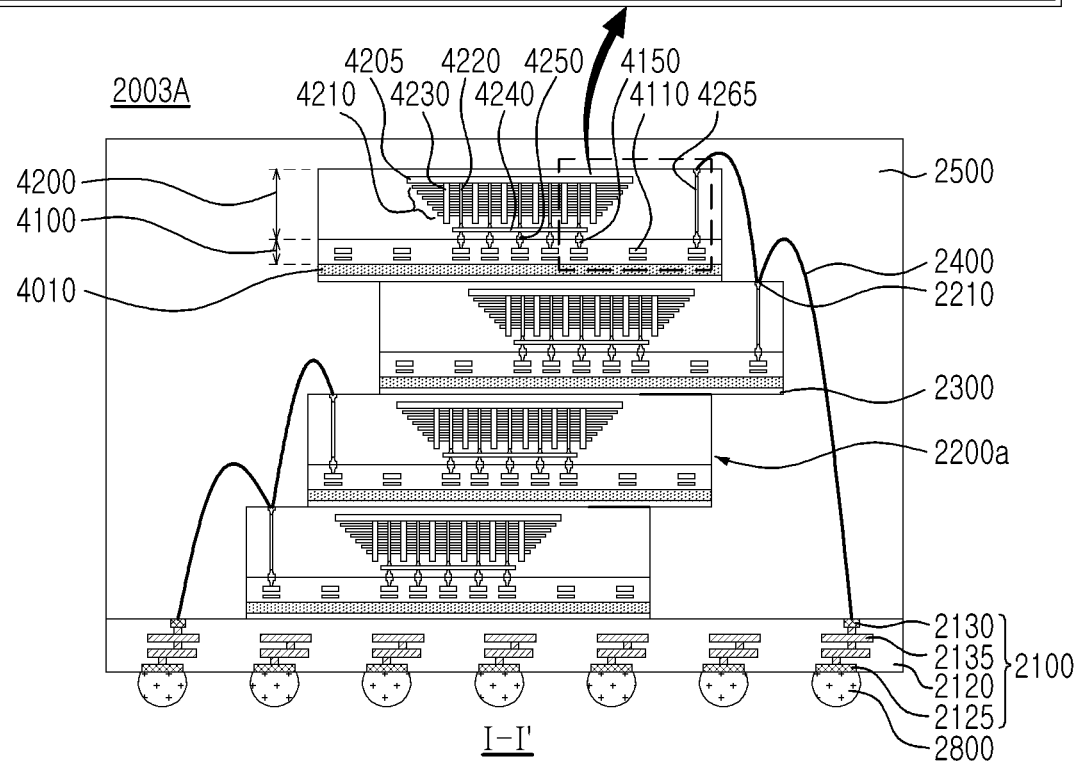

FIG. 18 is a cross-sectional view illustrating a semiconductor package according to an example embodiment. FIG. 18 illustrates example embodiments of the semiconductor package 2003 in FIG. 17, illustrating the semiconductor package 2003 in FIG. 17 taken along line I-I'.

Referring to FIG. 18, in a semiconductor package 2003, a package substrate 2100 may be configured as a printed circuit board. The package substrate 2100 may include a package substrate body portion 2120, package upper pads 2130 (see FIG. 17) disposed on the upper surface of the package substrate body portion 2120, lower pads 2125 disposed on or exposed through the lower surface of the package substrate body portion 2120, and internal interconnections 2135 electrically connecting the upper pads 2130 to the lower pads 2125 in the package substrate body portion 2120. The upper pads 2130 may be electrically connected to the connection structures 2400. The lower pads 2125 may be connected to the interconnection patterns 2005 of the main substrate 2010 of the data storage system 2000 as illustrated in FIG. 17 through conductive connection portions 2800.

Each of the semiconductor chips 2200a may include a semiconductor substrate 4010, and a first structure 4100 and a second structure 4200 stacked in order on the semiconductor substrate 4010. The first structure 4100 may include a peripheral circuit region including peripheral interconnections 4110. The second structure 4200 may include a common source line 4205, a gate stack structure 4210 on the common source line 4205, channel structures 4220 and separation regions 4230 penetrating the gate stack structure 4210, bit lines 4240 electrically connected to the memory channel structures 4220, and gate contact plugs electrically connected to the word lines WL (see FIG. 16) of the gate stack structure 4210. As described in the aforementioned example embodiment with reference to FIGS. 1 to 8, in each of the semiconductor chips 2200a, the contact plug 251' may be disposed to be in direct contact with the second via 265 physically spaced apart from the second substrate 201.

Each of the semiconductor chips 2200a may include a through interconnection electrically connected to the peripheral interconnections 4110 of the first structure 4100 and extending into the second structure 4200. The through interconnection may be disposed on an external side of the gate stack structure 4210, and may be further disposed to penetrate the gate stack structure 4210. Each of the semiconductor chips 2200a may further include an input and output pad 2210 (see FIG. 17) electrically connected to the peripheral interconnections 4110 of the first structure 4100, and the input/output pad 2210 may be a region including the conductive pad 270.

According to the aforementioned example embodiments, by disposing the landing via to be in direct contact with the input/output contact plug, a semiconductor device having improved reliability and mass producibility and a data storage system including the same may be provided.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
   a first semiconductor structure comprising a first substrate, circuit devices on the first substrate, a lower interconnection structure on the circuit devices, and a lower bonding structure electrically connected to the lower interconnection structure; and
   a second semiconductor structure comprising a second substrate on the first semiconductor structure, gate electrodes stacked and spaced apart from each other in a first direction perpendicular to a lower surface of the second substrate, channel structures that penetrate the gate electrodes and extend in the first direction, and an upper bonding structure electrically connected to the gate electrodes and the channel structures and bonded to the lower bonding structure, wherein the second semiconductor structure further comprises a first via connected to an upper portion of the second substrate, a second via spaced apart from the first via and spaced apart from the second substrate, and a contact plug in direct contact with the second via in an external side region of the second substrate.

2. The semiconductor device of claim 1, wherein a width of a lower portion of the second via that is closer to the second substrate is greater than a width of an upper portion of the second via, and wherein the contact plug is in direct contact with the lower portion of the second via.

3. The semiconductor device of claim 2, wherein the second semiconductor structure further comprises a conductive pad in direct contact with the upper portion of the second via.

4. The semiconductor device of claim 1, wherein the contact plug is electrically connected to the circuit devices through the upper bonding structure, the lower bonding structure, and the lower interconnection structure.

5. The semiconductor device of claim 1, wherein the first via and the second via comprise a same material.

6. The semiconductor device of claim 5, wherein the first via, the second via, and the second substrate comprise a semiconductor material including impurities of a same conductivity.

7. The semiconductor device of claim 5,
wherein the second substrate comprises a semiconductor material, and
wherein the first via and the second via comprise a metal material.

8. The semiconductor device of claim 1,
wherein the second semiconductor structure further comprises gate contacts connected to respective ones of the gate electrodes, and channel contacts connected to respective ones of the channel structures, and
wherein the gate contacts and the channel contacts are electrically connected to the upper bonding structure.

9. The semiconductor device of claim 1,
wherein the channel structures comprises a channel layer, and a gate dielectric layer between the channel layer and the gate electrodes and between the channel layer and the second substrate,
wherein the second semiconductor structure further comprises a horizontal conductive layer between the second substrate and the gate electrodes, and
wherein the horizontal conductive layer penetrates the gate dielectric layer, and is in direct contact with the channel layer.

10. A semiconductor device, comprising:
a first substrate;
circuit devices on the first substrate;
a lower interconnection structure electrically connected to the circuit devices;
a lower bonding structure electrically connected to the lower interconnection structure;
an upper bonding structure in contact with the lower bonding structure;
an upper interconnection structure electrically connected to the upper bonding structure;
a second substrate on the upper interconnection structure;
gate electrodes between the upper interconnection structure and the second substrate, wherein the gate electrodes are stacked and are spaced apart from each other;
channel structures that penetrate the gate electrodes, wherein each of the channel structures comprises a channel layer;
a contact plug that extends in a vertical direction perpendicular to an upper surface of the first substrate in an external side region of the gate electrodes and an external side region of the second substrate, wherein the contact plug comprises an upper end having a width smaller than a width of a lower end; and
a landing via with a lower end in direct contact with the upper end of the contact plug and with an upper end on a level higher than a level of an upper surface of the second substrate,
wherein the landing via is spaced apart from the second substrate.

11. The semiconductor device of claim 10, further comprising:
a conductive pad in contact with an upper end of the landing via.

12. The semiconductor device of claim 10, wherein a width of a lower portion of the landing via that is closer to the second substrate is greater than a width of an upper portion of the landing via.

13. The semiconductor device of claim 10,
wherein the landing via comprises a semiconductor layer and a metal-semiconductor compound layer between the semiconductor layer and the contact plug, and
wherein the metal-semiconductor compound layer is on at least a portion of an upper region of the contact plug and is on at least a portion of a side region of the contact plug.

14. The semiconductor device of claim 10, further comprising:
a ground via that extends from an upper portion of the second substrate.

15. The semiconductor device of claim 14, wherein the landing via and the ground via comprise a same material as a semiconductor material of the second substrate.

16. The semiconductor device of claim 14,
wherein the ground via is integrated with the second substrate and comprises a same semiconductor material as that of the second substrate, and
wherein the ground via comprises impurities of a same conductivity as impurities of the second substrate.

17. The semiconductor device of claim 14, wherein a width of a lower portion of the landing via that is closer to the second substrate is greater than a width of a lower portion of the ground via.

18. The semiconductor device of claim 10,
wherein the lower bonding structure comprises a lower bonding via connected to the lower interconnection structure and a lower bonding pad connected to the lower bonding via,
wherein the upper bonding structure comprises an upper bonding via electrically connected to the upper interconnection structure and an upper bonding pad electrically connected to the upper bonding via, and
wherein the lower bonding pad and the upper bonding pad are bonded to each other.

19. A data storage system, comprising:
a semiconductor storage device comprising a first substrate, circuit devices on the first substrate, a lower interconnection structure electrically connected to the circuit devices, a lower bonding structure electrically connected to the lower interconnection structure, an upper bonding structure in contact with the lower bonding structure, an upper interconnection structure electrically connected to the upper bonding structure, a second substrate on the upper interconnection structure, gate electrodes between the upper interconnection structure and the second substrate and stacked and spaced apart from each other, channel structures that penetrate the gate electrodes and each comprise a channel layer, a contact plug that extends in a vertical direction perpendicular to an upper surface of the first substrate in an external side region of the gate electrodes and an external side region of the second substrate, and has an upper end with a width that is smaller than a width of a lower end, a landing via with a lower end in direct contact with the upper end of the contact plug, with an upper end on a level higher than a level of an upper surface of the second substrate, and spaced apart from the second substrate, and an input/output pad in contact with the landing via and electrically connected to the circuit devices through the contact plug; and a controller electrically connected to the semiconductor storage device through the input/output pad, wherein the controller is configured to control the semiconductor storage device.

20. The data storage system of claim 19, wherein the semiconductor storage device further comprises a ground via that extends from an upper portion of the second substrate and comprises a portion having a width that decreases from the upper surface of the second substrate to an upper surface of the ground via, and wherein the contact plug, the landing via, and the input/output pad do not overlap the second substrate in the vertical direction perpendicular to the upper surface of the first substrate.

* * * * *